(12) United States Patent
Chung et al.

(10) Patent No.: US 12,033,995 B2
(45) Date of Patent: Jul. 9, 2024

(54) DISPLAY MODULE

(71) Applicant: SAMSUNG ELECTRONICS CO., LTD., Suwon-si (KR)

(72) Inventors: Changkyu Chung, Suwon-si (KR); Gyun Heo, Suwon-si (KR); Tackmo Lee, Suwon-si (KR); Kyungwoon Jang, Suwon-si (KR); Soonmin Hong, Suwon-si (KR); Daesuck Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/134,908

(22) Filed: Apr. 14, 2023

(65) Prior Publication Data

US 2023/0253388 A1 Aug. 10, 2023

Related U.S. Application Data

(63) Continuation of application No. PCT/KR2021/017288, filed on Nov. 23, 2021.

(30) Foreign Application Priority Data

Nov. 25, 2020 (KR) .................. 10-2020-0160257

(51) Int. Cl.
*H01L 25/16* (2023.01)
*G09G 3/32* (2016.01)
*H01L 33/62* (2010.01)

(52) U.S. Cl.
CPC ............. *H01L 25/167* (2013.01); *G09G 3/32* (2013.01); *H01L 33/62* (2013.01);
(Continued)

(58) Field of Classification Search
CPC .. G09F 9/3026; G09G 3/32; G09G 2300/026; G09G 2300/0426; G09G 2300/0452;
(Continued)

(56) References Cited

U.S. PATENT DOCUMENTS 8,780,023 B2    7/2014  Ootorii
10,748,884 B2   8/2020  Ko et al.
(Continued)

FOREIGN PATENT DOCUMENTS

CN      208767335 U    4/2019
CN      209447798 U    9/2019
(Continued)

OTHER PUBLICATIONS

Communication dated Mar. 14, 2022, issued by the International Searching Authority in counterpart International Application No. PCT/KR2021/017288 (PCT/ISA/210).
(Continued)

*Primary Examiner* — Stacy Khoo
(74) *Attorney, Agent, or Firm* — Sughrue Mion, PLLC

(57) ABSTRACT

A display module, including a plurality of pixels, includes: a first substrate; a plurality of micro pixel packages provided on an upper surface of the first substrate; and a driver integrated circuit (IC) configured to transmit a driving signal to the plurality of micro pixel packages. Each of the plurality of micro pixel packages includes a second substrate; a plurality of inorganic light emitting devices provided on an upper surface of the second substrate; and a micro pixel controller provided on a lower surface of the second substrate, the micro pixel controller being configured to control the plurality of inorganic light emitting devices.

20 Claims, 40 Drawing Sheets

(52) U.S. Cl.
CPC ............... *G09G 2300/026* (2013.01); *G09G 2300/0426* (2013.01); *G09G 2300/0452* (2013.01); *G09G 2300/0842* (2013.01)

(58) Field of Classification Search
CPC ........ G09G 2300/0842; H01L 25/0753; H01L 25/167; H01L 27/1214; H01L 29/78672; H01L 33/62
See application file for complete search history.

(56) References Cited

U.S. PATENT DOCUMENTS

| | | |
|---|---|---|
| 10,756,073 B2 | 8/2020 | Kim et al. |
| 10,832,615 B2 | 11/2020 | Kim et al. |
| 10,847,548 B2 | 11/2020 | Bang |
| 10,886,446 B2 | 1/2021 | Ahn et al. |
| 10,964,868 B2 | 3/2021 | Song |
| 11,239,122 B2 | 2/2022 | Jung et al. |
| 11,404,403 B2 | 8/2022 | Chung et al. |
| 11,424,214 B1 * | 8/2022 | Brodoceanu ............ H01L 24/13 |
| 11,430,705 B2 | 8/2022 | Han et al. |
| 2012/0256814 A1 | 10/2012 | Ootorii |
| 2016/0033113 A1 * | 2/2016 | Nadershahi ............ G02B 27/00 362/97.1 |
| 2016/0351539 A1 | 12/2016 | Bower et al. |
| 2020/0303608 A1 * | 9/2020 | Song ................ H01L 33/62 |
| 2021/0375833 A1 | 12/2021 | Lee et al. |

FOREIGN PATENT DOCUMENTS

| | | |
|---|---|---|
| CN | 110649010 A | 1/2020 |
| CN | 111933630 A | 11/2020 |
| JP | 5966412 B2 | 8/2016 |
| KR | 10-2019-0006430 A | 1/2019 |
| KR | 10-2019-0053347 A | 5/2019 |
| KR | 10-2019-0114738 A | 10/2019 |
| KR | 10-2019-0125084 A | 11/2019 |
| KR | 10-2019-0137658 A | 12/2019 |
| KR | 10-2020-0015082 A | 2/2020 |
| KR | 10-2020-0050614 A | 5/2020 |
| KR | 10-2020-0076581 A | 6/2020 |
| KR | 10-2020-0111924 A | 10/2020 |
| KR | 10-2020-0119581 A | 10/2020 |
| KR | 10-2021-0004324 A | 1/2021 |
| WO | WO-2019013469 A1 * | 1/2019 ........... H01L 21/027 |

OTHER PUBLICATIONS

Communication dated Mar. 14, 2022, issued by the International Searching Authority in counterpart International Application No. PCT/KR2021/017288 (PCT/ISA/237).

Communication issued on Mar. 5, 2024 by the European Patent Office for European Patent Application No. 21898560.4.

* cited by examiner

DISPLAY MODULE

CROSS-REFERENCE TO RELATED APPLICATIONS

This application is a continuation application of International Application No. PCT/KR2021/017288, filed on Nov. 23, 2021, which is based on and claims priority to Korean Patent Application No. 10-2020-0160257, filed on Nov. 25, 2020, in the Korean Intellectual Property Office, the disclosures of which are incorporated by reference herein in their entireties.

BACKGROUND

1. Field

The disclosure relates to a display module that implements an image using inorganic light emitting devices.

2. Description of Related Art

Display devices may be divided into self-luminous displays that emit light for themselves and light emitting displays that require an extra light source.

A liquid crystal display (LCD) is a representative light emitting display, which is structurally complex and has a limit to implement thinness because the LCD requires a backlight unit for supplying light from behind a display panel, a liquid crystal layer that serves as a switch to pass/block the light, color filters that change the supplied light into desired color, and other components.

Self-luminous displays having pixels, each of which equipped with a light emitting device to emit light for itself, dispenses with elements such as the backlight unit and the liquid crystal layer, and may additionally not include color filters as well, such that a self-luminous display has a simple structure and may thus have a high degree of design freedom. Furthermore, self-luminous displays may implement not only thinness but also a good contrast ratio, brightness and viewing angle.

Of the self-luminous displays, a micro light emitting diode (LED) display is one of flat displays, which includes a plurality of micro-sized LEDs. As compared to the LCD that requires backlight, the micro LED display may provide better contrast, response time and energy efficiency.

Furthermore, the micro LED, which is an inorganic light emitting device, is brighter, has better light emitting efficiency and has a longer lifespan than the organic LED (OLED) that requires an extra encapsulation layer to protect organic materials.

SUMMARY

Provided is a display module having a thin-film transistor circuit to drive an inorganic light emitting device arranged in a separate chip to facilitate circuit inspection and replacement and a manufacturing process of a display device.

According to an aspect of the disclosure, a display module, including a plurality of pixels, may include: a first substrate; a plurality of micro pixel packages provided on an upper surface of the first substrate; and a driver integrated circuit (IC) configured to transmit a driving signal to the plurality of micro pixel packages. Each of the plurality of micro pixel packages may include a second substrate; a plurality of inorganic light emitting devices provided on an upper surface of the second substrate; and a micro pixel controller provided on a lower surface of the second substrate, the micro pixel controller being configured to control the plurality of inorganic light emitting devices.

Each of the plurality of pixels may include at least two of the plurality of inorganic light emitting devices. The plurality of inorganic light emitting devices may form at least two of the plurality of pixels.

Each of the micro pixel packages may be electrically connected to the first substrate by at least one solder ball.

The at least one solder ball may have a height greater than a thickness of the micro pixel controller.

The micro pixel controller may be further configured to switch the plurality of inorganic light emitting devices and apply a driving current to the plurality of inorganic light emitting devices.

The micro pixel controller may include a third substrate; and at least one thin film transistor provided on the third substrate. The at least one thin film transistor may be configured to switch the plurality of inorganic light emitting devices and apply a driving current to the plurality of inorganic light emitting devices.

The at least one thin film transistor may include a low temperature polycrystalline silicon (LTPS) thin film transistor.

The second substrate may include a glass substrate and the third substrate may include a silicon substrate.

The plurality of pixels may have gaps of a same size between neighboring pixels of the plurality of pixels.

The plurality of micro pixel packages may be arranged so that gaps between neighboring pixels of the plurality of pixels are the same.

At least some of the plurality of inorganic light emitting devices and a portion of the micro pixel controller overlap each other in a vertical direction.

Each of the plurality of pixels may include at least three sub-pixels, each of which is configured to output a different color of light.

Each of the plurality of pixels may include a red inorganic light emitting device, a green inorganic light emitting device and a blue inorganic light emitting device of the plurality of inorganic light emitting devices.

The micro pixel controller may be electrically connected to the plurality of inorganic light emitting devices through at least one of a via hole wire and a side wire disposed on the second substrate.

The display module may further include: a black matrix layer disposed on the upper surface of the first substrate; and a black matrix layer disposed on the upper surface of the second substrate.

A display including a plurality of pixels, may include: a plurality of display modules; a housing configured to present the plurality of display modules in a two-dimensional array; and a timing controller configured to send a display signal to the plurality of display modules. Each of the plurality of display modules may include: a first substrate, a plurality of micro pixel packages provided on an upper surface of the first substrate, and a driver integrated circuit (IC) configured to transmit a driving signal to the plurality of micro pixel packages. Each of the plurality of micro pixel packages comprises a second substrate, a plurality of inorganic light emitting devices provided on an upper surface of the second substrate, and a micro pixel controller disposed on a lower surface of the second substrate, the micro pixel controller being configured to control the plurality of inorganic light emitting devices.

The micro pixel controller may include a third substrate; and at least one thin film transistor provided on the third substrate. The at least one thin film transistor may be configured to switch the plurality of inorganic light emitting devices and apply a driving current to the plurality of inorganic light emitting devices.

The at least one thin film transistor may include a low temperature polycrystalline silicon (LTPS) thin film transistor.

The second substrate may include a glass substrate. The third substrate may include a silicon substrate.

Each of the plurality of pixels may include a red inorganic light emitting device, a green inorganic light emitting device and a blue inorganic light emitting device of the plurality of inorganic light emitting devices.

According to one or more embodiments of the disclosure, a display module may have a thin film transistor circuit to drive an inorganic light emitting device arranged in a separate chip, thereby facilitating circuit inspection and replacement and a manufacturing process of a display device.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
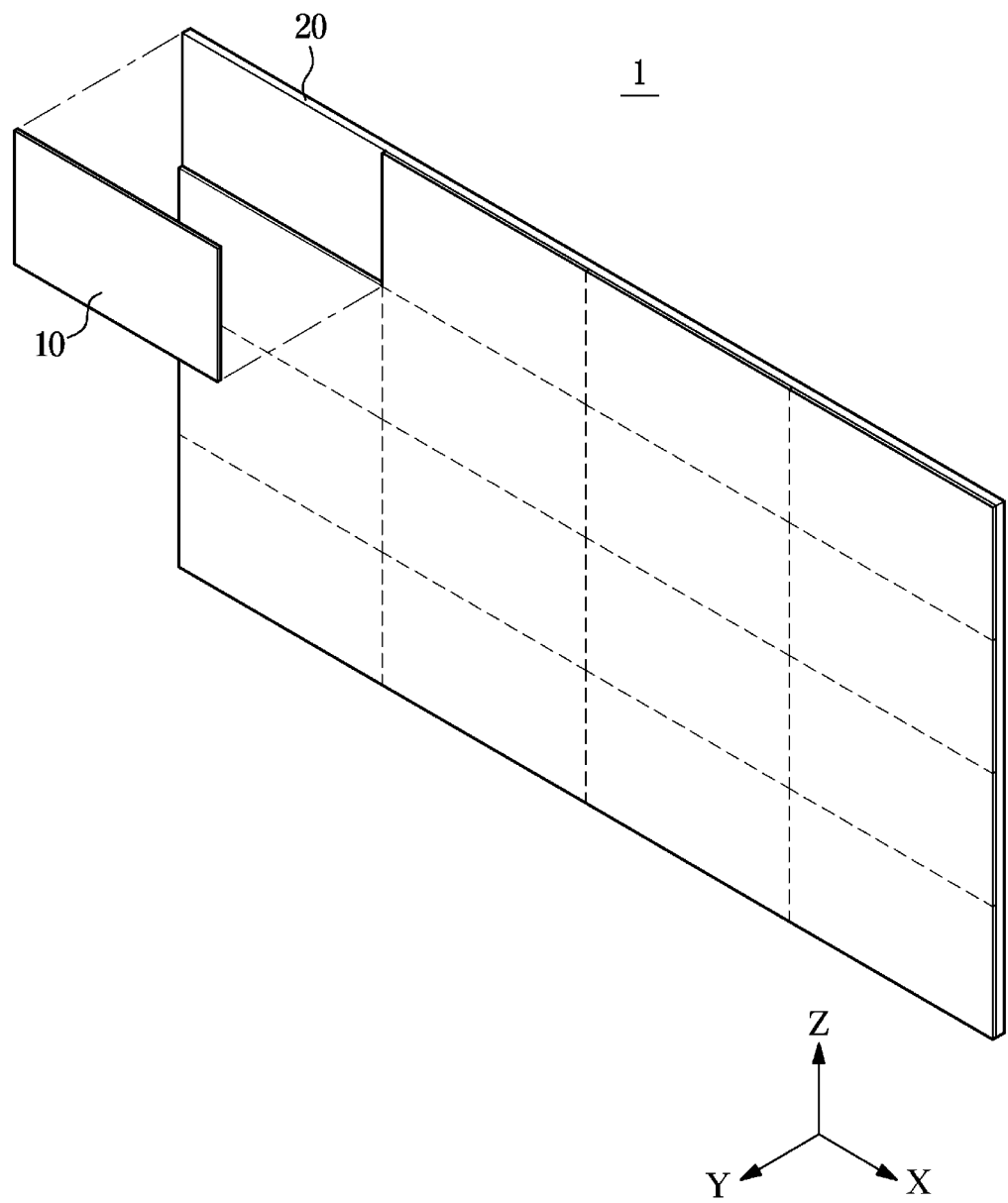
FIG. 1 is a perspective view illustrating an example of a display module and a display device including the display module, according to an embodiment.

Like numerals refer to like elements throughout the specification. Not all elements of embodiments of the disclosure will be described, and description of what are commonly known in the art or what overlap each other in the embodiments will be omitted. The term 'unit, module, member, or block' may refer to what is implemented in software or hardware, and a plurality of units, modules, members, or blocks may be integrated in one component or the unit, module, member, or block may include a plurality of components, depending on the embodiment of the disclosure.

It will be further understood that the term "connect" or its derivatives refer both to direct and indirect connection, and the indirect connection includes a connection over a wireless communication network or an electric connection by wiring, soldering, etc.

The term "include (or including)" or "comprise (or comprising)" is inclusive or open-ended and does not exclude additional, unrecited elements or method steps, unless otherwise mentioned.

Throughout the specification, when it is said that a member is located "on" another member, it implies not only that the member is located adjacent to the other member but also that a third member exists between the two members.

Throughout the specification, when a component is mentioned to send or transmit a signal to another component, it does not exclude a possibility of an intermediate component that exists between the two components, through which to send or transmit the signal, unless otherwise mentioned.

Throughout the specification, ordinal numbers used before components are used to distinguish the components from one another, and do not imply order of arrangement, manufacturing, or importance.

It is to be understood that the singular forms "a," "an," and "the" include plural references unless the context clearly dictates otherwise.

Reference numerals used to denote method steps are just used for convenience of explanation, but not to limit an order of the steps. Thus, unless the context clearly dictates otherwise, the written order may be practiced otherwise.

Embodiments of a display module, a display device and a method of manufacturing the display module according to an embodiment will now be described in detail with reference to accompanying drawings.

Figure 2:
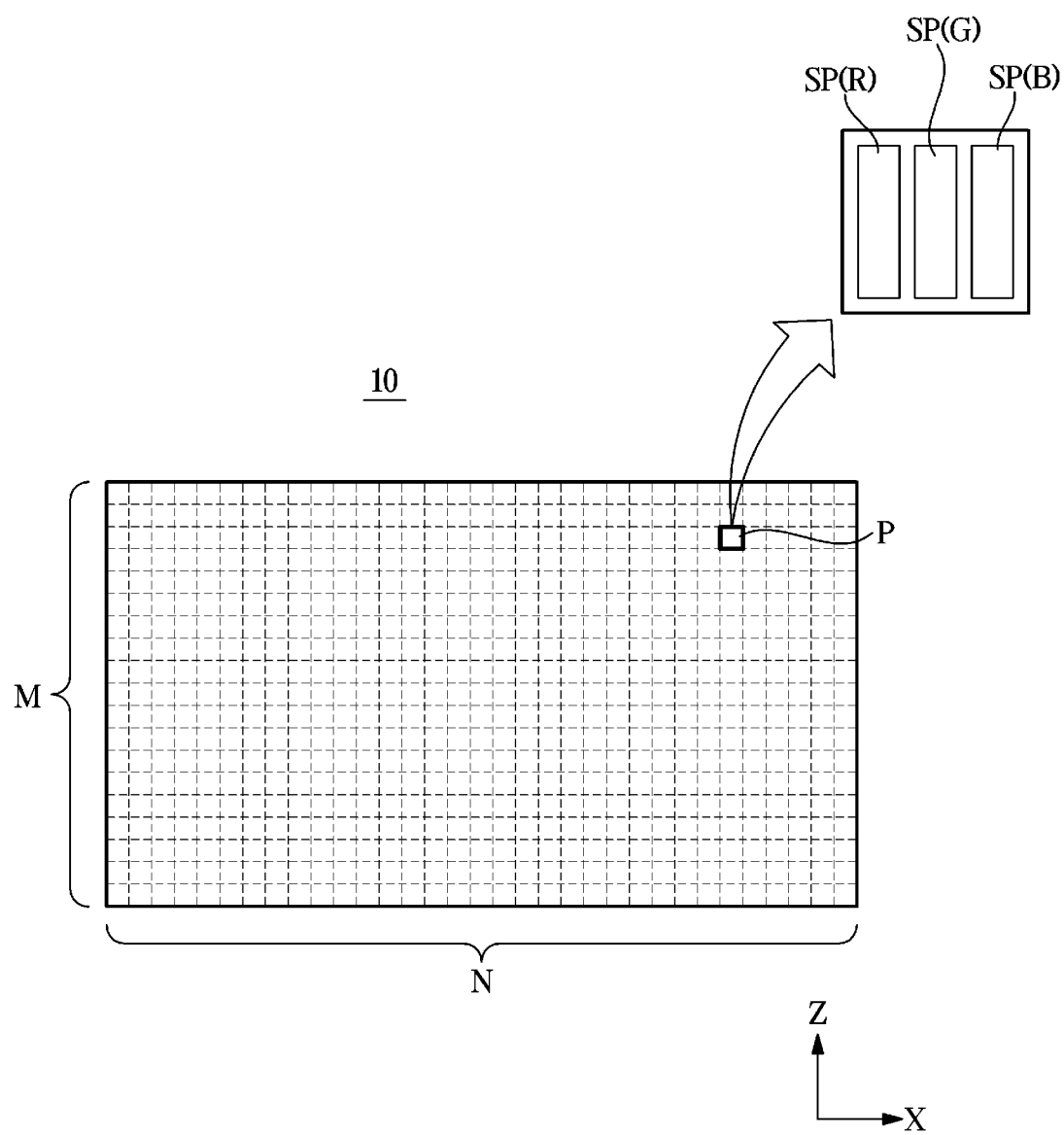
FIG. 2 illustrates an example of arrangement of pixels that make up a unit module of a display device, according to an embodiment.

FIG. 1 is a perspective view illustrating an example of a display module and a display device including the display module, according to an embodiment, and FIG. 2 illustrates an example of arrangement of pixels that make up a unit module of a display device, according to an embodiment.

A display device 1 may be a self-luminous display device having pixels each having a light emitting device arranged therein to emit light for itself. Hence, unlike a liquid crystal display (LCD) device, the display device 1 dispenses with such components as a backlight unit and a liquid crystal layer, thereby implementing thinness, having a simple structure, and allowing various changes in design.

The display device 1 may employ an inorganic light emitting device such as an inorganic light emitting diode (LED) for the light emitting device arranged in each pixel. The inorganic light emitting device may have quick response speed as compared with an organic light emitting device such as an organic LED (OLED) and may implement high brightness at low electric power.

Unlike the organic light emitting device that is vulnerable to exposure to water and oxygen and requires an encapsulation process and has weak durability, the inorganic light emitting device has strong durability without a need for the encapsulation process. Hereinafter, the inorganic light emitting device, as will be mentioned in the following embodiment, refers to the inorganic LED.

The inorganic light emitting device employed in the display device 1 may be a micro LED, a short side of which has a size of about 100 μm, about a few tens of μm or a few μm. By employing the micro-sized LEDs, pixel size may be reduced and high resolution may be implemented within the same size screen.

When an LED chip is manufactured to have a micro size, a problem of an inorganic material breaking by nature when bent may be solved. Specifically, when the micro LED chip is transferred onto a flexible substrate, the LED chip may not break even when the substrate is bent, making it possible to implement a flexible display device.

The display device employing the micro LED may be applied in various fields by using the subminiature pixel size and great thinness. For example, as shown in FIG. 1, a large-area screen may be implemented by tiling and fixing a plurality of display modules 10, onto which a plurality of micro LEDs are transferred, to a housing 20, and the large-area screen display device may be used as a signage, a billboard, or other large screen devices.

A three-dimensional (3D) coordinate system of XYZ-axes shown in FIG. 1 may be based on the display device 1, in which case the screen of the display device 1 is located in the plane XZ and a direction in which the image is output or in which light is emitted from the inorganic light emitting device is direction +Y. As the coordinate system is based on the display device 1, the same coordinate system may be applied to an occasion when the display device 1 lies on a side and an occasion when the display device 1 stands up.

The display device 1 may be used in a standing position and the user watches the image in front of the display device 1, so the direction +Y in which the image is output may be called a forward direction and the opposite direction a rearward direction.

The display device 1 may be manufactured in a lying position. Accordingly, it is also possible to call the direction −Y of the display device 1 a downward direction and the direction +Y an upward direction. In the following embodiments, the direction +Y may be called the upward direction or the forward direction and the direction −Y may be called the downward direction or the rearward direction.

Four surfaces other than the upper and lower surfaces of the display device 1 or the display module 10 of a flat form will be herein called side surfaces regardless of the posture of the display device 1 or the display module 10.

Although the display device 1 is shown as including a plurality of display modules to implement a large-area screen in the example of FIG. 1, embodiments of the display device 1 are not limited thereto. It is also possible for the display device 1 to include the single display module 10 to be implemented as a television, a wearable device, a portable device, a personal computer (PC) monitor, or other electronic display device.

Referring to FIG. 2, the display module 10 may include M×N (M and N are integers equal to or greater than 2) pixels, i.e., a plurality of pixels arranged in two dimensions (2D). Conceptual pixel arrangement is illustrated in FIG. 2, and it is obvious that there may be a bezel area or a wiring area in which no image is displayed may be arranged in the display module 10 in addition to an active area in which the pixels are arranged.

The fact that some components are arranged in 2D may include not only an occasion when the components are arranged in the same plane but also an occasion when the components are arranged in different parallel planes. Furthermore, in the case that the components are arranged in the same plane, tops of the components are not necessarily leveled in the same plane but may also be in different parallel planes.

As shown in FIG. 2, a pixel P may include at least three sub-pixels which output different colors of light. For example, the unit pixel P may include three sub-pixels SP (R), SP (G), and SP (B) corresponding to red (R), green (G), and blue (B), respectively. The red sub-pixel SP (R) may output red light, the green sub-pixel SP (G) may output green light, and the blue sub-pixel SP (B) may output blue light.

The above described pixel arrangement is, however, only one example to be applied to the display module 10 and the display device 1. The sub-pixels may also be arranged along the axis Z, not be arranged in one line, or be implemented in different sizes. In most embodiments, a single pixel includes a plurality of sub-pixels to implement multiple colors without limitations on the size or arrangement scheme of the sub-pixels.

The pixel P does not need to include the red sub-pixel SP (R) that outputs red light, the green sub-pixel SP (G) that outputs green light, and the blue sub-pixel SP (B) that outputs blue light, but may include a sub-pixel that outputs yellow light or white light. That is, there are no limitations on the color of light output from each sub-pixel, the sub-pixel type or the number of the sub-pixels.

In the following embodiments, for specific explanation, an occasion when the pixel P includes the red sub-pixel SP (R), the green sub-pixel SR (G) and the blue sub-pixel SP (B) will be taken as an example.

As described above, the display module 10 and the display device 1 may be a self-luminous display device having pixels each capable of emitting light for itself. Hence, sub-pixels may have inorganic light emitting devices that emit different colors of light. For example, a red inorganic light emitting device may be arranged in the red sub-pixel SP (R), a green inorganic light emitting device may be arranged in the green sub-pixel SP (G), and a blue inorganic light emitting device may be arranged in the blue sub-pixel SP (B).

Accordingly, the pixel P may refer to a cluster including a red inorganic light emitting device, a green inorganic light emitting device and a blue inorganic light emitting device, and the sub-pixel may refer to each inorganic light emitting device.

Figure 3:
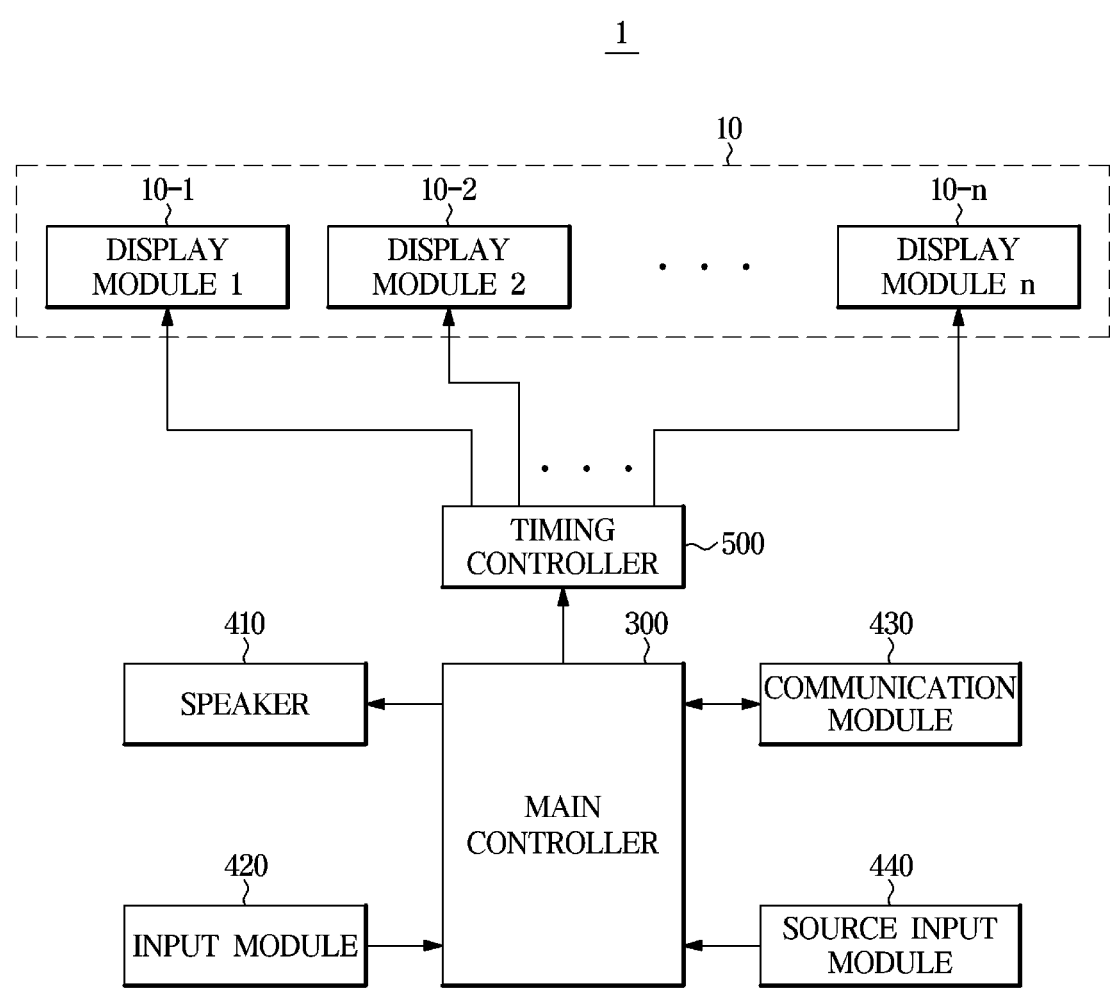
FIG. 3 is a control block diagram of a display device, according to an embodiment.

FIG. 3 is a control block diagram of a display device, according to an embodiment.

As described above in connection with FIG. 1, the display device 1 may include a plurality of display modules 10-1, 10-2, . . . , 10-n, where n is an integer equal to or greater than 2, a main controller 300 and timing controller 500 for controlling the plurality of display modules 10, a communication module 430 for communicating with an external device, a source input module 440 for receiving a source image, a speaker 410 for outputting sound, and an input module 420 for receiving a command to control the display device 1 from a user.

The input module 420 may include a button (buttons) or a touch pad arranged in a region of the display device 1, or the input module 420 may include a touch pad arranged on the front surface of a display panel 11 (see FIG. 4) when the display panel 11 is implemented as a touch screen. It is also possible for the input module 420 to include a remote controller.

The input module 420 may receive various commands from the user to control the display device 1, such as power on/off, volume control, channel tuning, screen adjustment, various settings change, etc.

The speaker 410 may be arranged in a portion of the main body 20, or an extra speaker module physically separated from the main body 20 may be further provided.

The communication module 430 may communicate with a relay server or another electronic device to exchange data required. The communication module 430 may employ at least one of various radio communication methods such as third generation (3G), fourth generation (4G), wireless local area network (WLAN), wireless fidelity (Wi-Fi), Bluetooth, Zigbee, Wi-Fi direct (WFD), ultra-wideband (UWB), infrared data association (IrDA), Bluetooth low energy (BLE), near field communication (NFC), Z-wave, etc. It is also possible to employ a wired communication method such as peripheral component interconnect (PCI), PCI-express, or universal serial bus (USB).

The source input module 440 may receive a source signal input from a set top box, a USB, or an antenna. Hence, the source input module 440 may include at least one selected from a source input interface group including a high-definition multimedia interface (HDMI) cable port, a USB port, and an antenna.

The source signal received by the source input module 440 may be processed by the main controller 300 and converted into a format that may be output from the display panel 11 and the speaker 410.

The controller 300 and the timing controller 500 may include at least one memory for storing a program and various types of data to perform operations, which will be described later, and at least one processor for executing the stored program.

The main controller 300 may process the source signal input through the source input module 440 to create an image signal corresponding to the input source signal.

For example, the main controller 300 may include a source decoder, a scaler, an image enhancer and a graphic processor. The source decoder may decode a source signal compressed in such a format as MPEG, and the scaler may output image data of a desired resolution through resolution conversion.

The image enhancer may enhance image quality of the image data by applying various correction techniques. The graphic processor may sort the image data into RGB data, and output the RGB data along with a control signal such as a syncing signal for display timing on the display panel 11. In other words, the main controller 300 may output image data corresponding to a source signal with a control signal.

The aforementioned operations of the main controller 300 are merely an example that is applicable to the display device 1, and it is obvious that an additional operation may be further performed or some of the aforementioned operations may be omitted.

The image data and control signal output from the main controller 300 may be sent to the timing controller 500.

The timing controller 500 may convert the image data sent from the main controller 300 into a format that may be processed in a driver integrated circuit (IC) 200 (see FIG. 4) and generate various control signals such as a timing control signal required to display the image data on the display panel 11.

The display device 1 does not need to include the plurality of display modules 10, but in the following embodiments, the display device 1 including the plurality of display modules 10 will be taken as an example for specific explanation and operation of each of the components will be described in detail.

Figure 4:
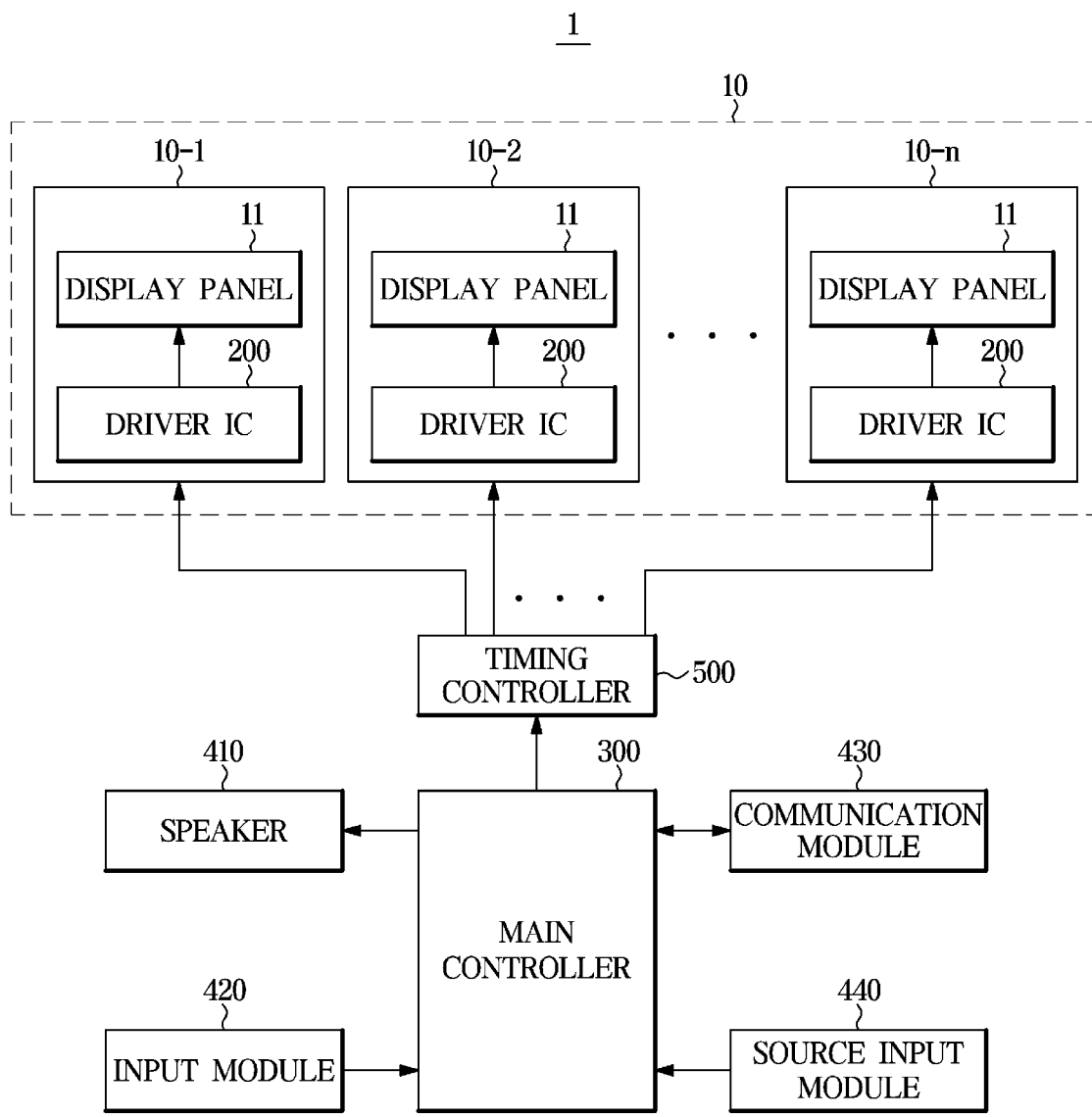
FIG. 4 is a control block diagram in which a configuration of a display module included in a display device is specified, according to an embodiment.
Figure 5:
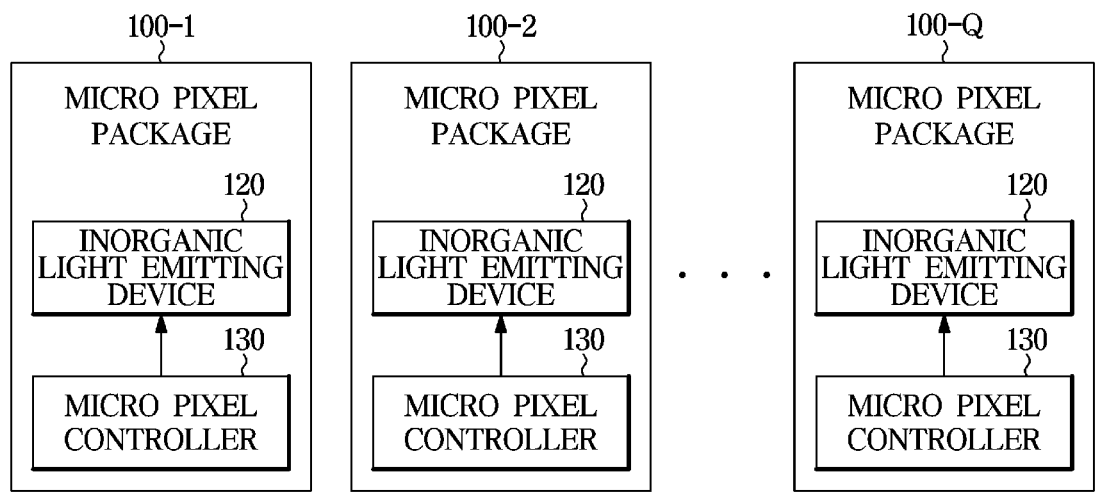
FIG. 5 is a control block diagram in which a configuration of a display panel included in a display module is specified, according to an embodiment.

FIG. 4 is a control block diagram in which a configuration of a display module included in a display device is specified, according to an embodiment, and FIG. 5 is a control block diagram in which a configuration of a display panel included in a display module is specified, according to an embodiment.

Referring to FIG. 4, the plurality of display modules 10-1, 10-2, ..., and 10-n may each include a display panel 11 for displaying an image and the driver IC 200 for driving the display panel 11.

The driver IC 200 may generate a driving signal for the display panel 11 to display an image, based on image data and a control signal sent from the timing controller 500.

The driving signal generated by the driver IC 200 may include a gate signal and a data signal and may be input to the display panel 11.

Referring to FIG. 5, the display panel 11 may include a plurality of micro pixel packages 100-1, 100-2, ..., 100-q, each of which includes inorganic light emitting devices 120 and a micro pixel controller 130. Although there are three or more micro pixel packages 100 shown in this example, embodiments of the display module 10 are not limited thereto. The micro pixel package 100 may be provided in the plural, where q is an integer equal to or greater than 2, and there is no limitation on the number of the micro pixel packages 100.

The display panel 11 may include a plurality of pixels arranged in 2D as described above, and each of the pixels may include a plurality of sub-pixels to implement various colors.

As described above, the display device 1 is the self-luminous display device having pixels each capable of emitting light for itself. Accordingly, the inorganic light emitting device 120 may be arranged in each sub-pixel. In other words, each of the plurality of pixels may be comprised of two or more inorganic light emitting devices 120.

The respective inorganic light emitting devices 120 may be driven in an active matrix (AM) method or a passive matrix (PM) method, and in the following embodiments, for specific explanation, an occasion when the inorganic light emitting devices 120 are driven in the AM method will be taken as an example.

In the display module 10, each of the inorganic light emitting device 120 may be individually controlled by the micro pixel controller 130, which may be operated based on a driving signal output from the driver IC 200.

Figure 6:
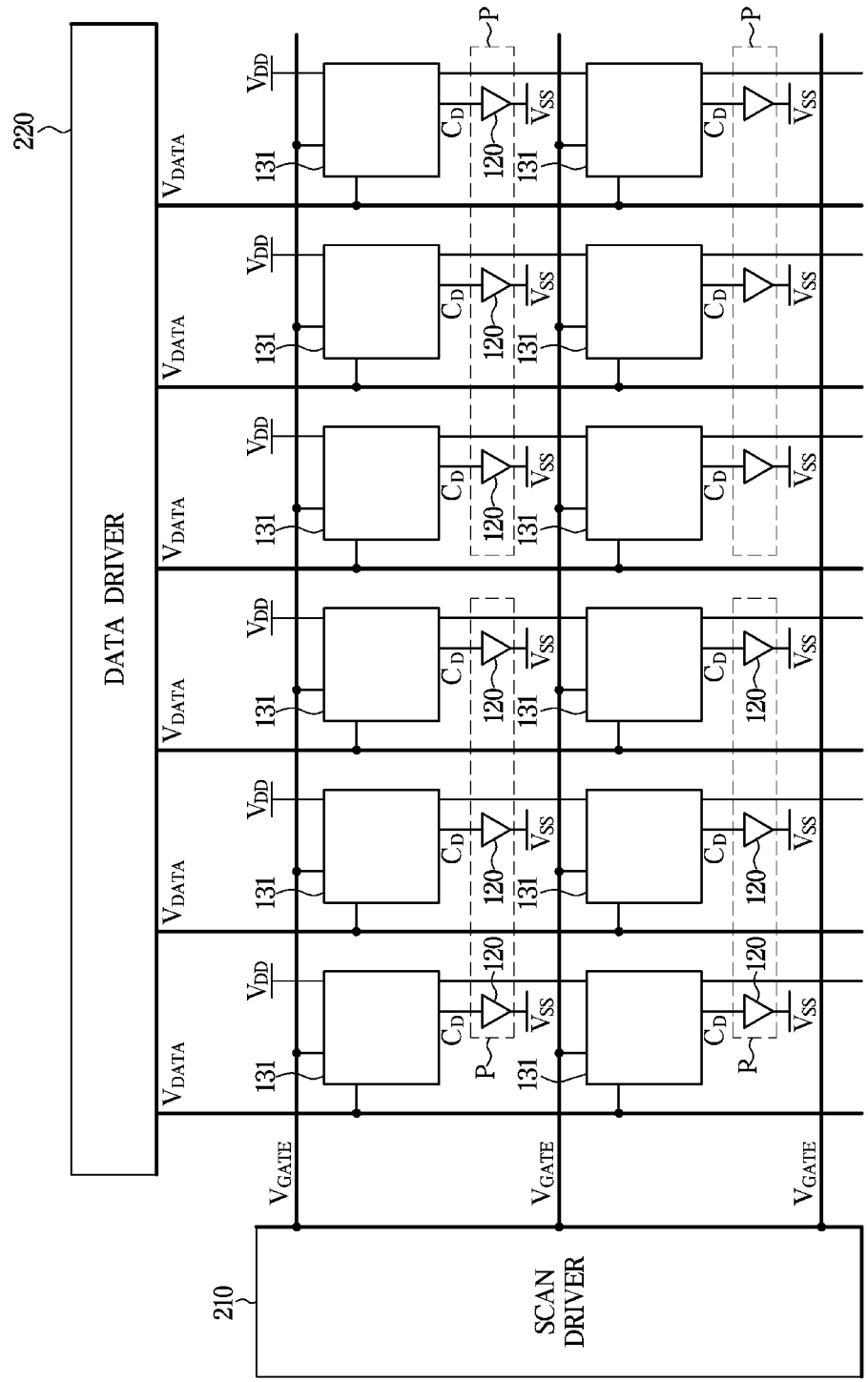
FIG. 6 is a diagram for conceptually describing how each pixel is operated in a display module, according to an embodiment.

FIG. 6 is a diagram for conceptually describing how each pixel is operated in a display module, according to an embodiment.

Referring to FIG. 6, the driver IC 200 may include a scan driver 210 and a data driver 220. The scan driver 210 may output a gate signal to turn on or off the sub-pixel, and the data driver 220 may output a data signal to implement an image. However, depending on various changes in design, it is also possible to perform some of the operations of the driver IC 200 in the micro pixel controller 130. For example, the operation of the scan driver 210 may be performed by the micro pixel controller 130, in which case the driver IC 200 may not include the scan driver 210. In the following embodiments, for specific explanation, an occasion when the driver IC 200 includes both the scan driver 210 and the data driver 220 will be taken as an example.

The scan driver 210 may generate a gate signal based on a timing control signal sent from the timing controller 500, and the data driver 220 may generate a data signal based on image data sent from the timing controller 500.

The micro pixel controller 130 may include a pixel circuit 131 for individually controlling each inorganic light emitting device 120, and the gate signal output from the scan driver 210 and the data signal output from the data driver 220 may be input to the pixel circuit 131.

For example, when gate voltage VGATE, data voltage VDATA and power voltage $V_{DD}$ are input to the pixel circuit 131, the pixel circuit 131 may output a driving current $C_D$ to drive the inorganic light emitting device 120.

The driving current $C_D$ output from the pixel circuit 131 may be input to the inorganic light emitting device 120, which may in turn emit light based on the input driving current $C_D$ to implement an image.

Figure 7:
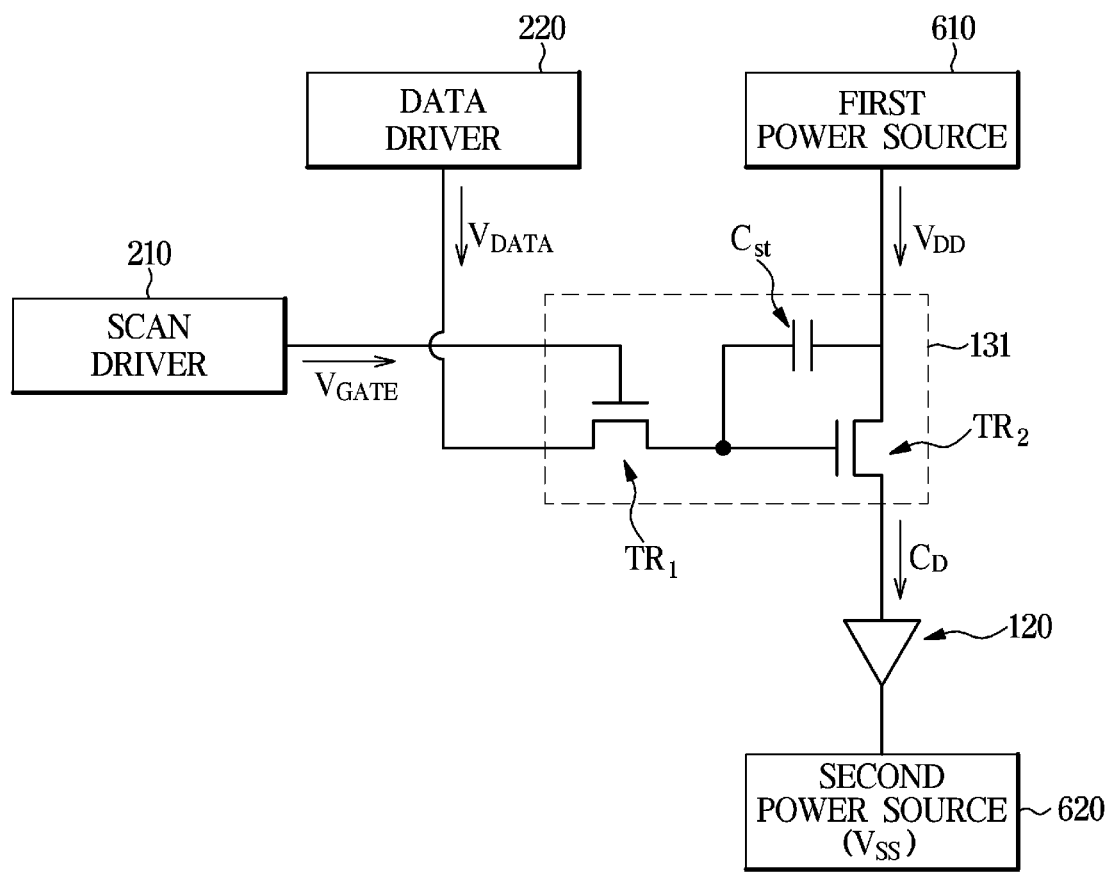
FIG. 7 is a circuit diagram schematically illustrating a pixel circuit for controlling a single sub-pixel in a display module, according to an embodiment.
Figure 8:
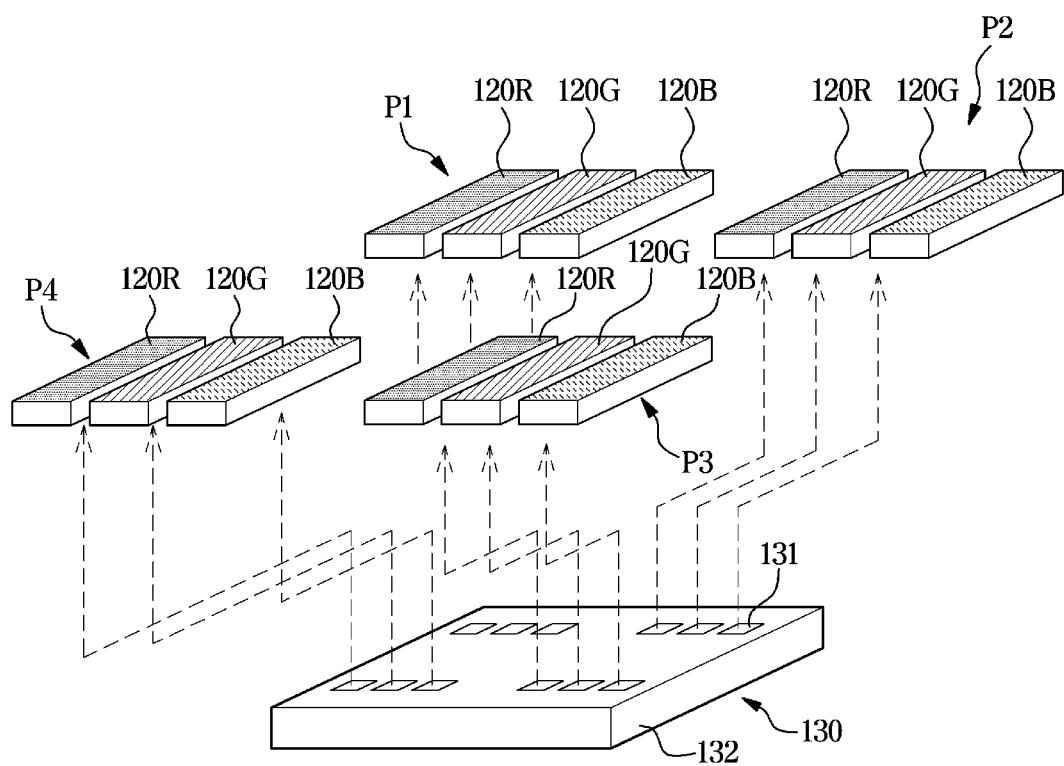
FIG. 8 is a diagram conceptually illustrating a relation between a micro pixel controller and pixels controlled by the micro pixel controller in a display module, according to an embodiment.

FIG. 7 is a circuit diagram schematically illustrating a pixel circuit for controlling a single sub-pixel in a display module, according to an embodiment, and FIG. 8 is a diagram conceptually illustrating a relation between a micro pixel controller and a pixel controlled by the micro pixel controller in a display module, according to an embodiment.

Referring to FIG. 7, the pixel circuit 131 may include thin film transistors $TR_1$ and $TR_2$ to switch or drive the inorganic light emitting device 120 and a capacitor Cst. As described above, the inorganic light emitting device 120 may be a micro LED.

For example, the thin film transistors $TR_1$ and $TR_2$ may include a switching transistor $TR_1$ and a driving transistor $TR_2$, and the switching transistor $TR_1$ and the driving transistor $TR_2$ may be implemented with positive channel metal-oxide semiconductor (PMOS) transistors. Embodiments of the display module 10 and the display device 1 are not, however, limited thereto, and it is obvious that the switching transistor $TR_1$ and the driving transistor $TR_2$ may also be implemented with negative channel metal-oxide semiconductor (NMOS) transistors.

Of the switching transistor $TR_1$, a gate electrode is connected to the scan driver 210, a source electrode is connected to the data driver 220, and a drain electrode is connected to an end of the capacitor Cst and a gate electrode of the driving transistor $TR_2$. The other end of the capacitor Cst may be connected to a first power source 610.

Of the driving transistor $TR_2$, a source electrode is connected to the first power source 610 that applies a power voltage $V_{DD}$ and a drain electrode is connected to the anode of the inorganic light emitting device 120. The cathode of the inorganic light emitting device 120 may be connected to a second power source 620 that applies a reference voltage $V_{SS}$. The reference voltage $V_{SS}$ has a lower level than the power voltage $V_{DD}$, for which a ground voltage is used to serve earthing.

The pixel circuit in the aforementioned structure may operate as follows. First, when the gate voltage VGATE is applied from the scan driver 210 to turn on the switching transistor $TR_1$, data voltage VDATA applied from the data driver 220 may be applied to the end of the capacitor $C_{st}$ and the gate electrode of the driving transistor $TR_2$.

A voltage corresponding to a gate-source voltage $V_{GS}$ of the driving transistor $TR_2$ may be maintained by the capacitor Cst for a certain period of time. The driving transistor $TR_2$ may make the inorganic light emitting device 120 emit light by applying a driving current $C_D$ corresponding to the gate-source voltage $V_{GS}$ to the anode of the inorganic light emitting device 120.

However, the aforementioned structure of the pixel circuit 131 is merely an example that may be applied to the display module 10, and other various circuit structures may also be applied to switch and drive the plurality of inorganic light emitting device 120.

There are no limitations on the method of controlling brightness of the inorganic light emitting device 120. Brightness of the inorganic light emitting device 120 may be controlled in one of various methods such as a pulse amplitude modulation (PAM) method, a pulse width modulation (PWM) method and a hybrid method that combines the PAM method and the PWM method.

In the display module 10, one micro pixel controller 130 may control a plurality of pixels. In this case, controlling the pixel may mean controlling the plurality of inorganic light emitting devices 120 that make up the pixel.

There are no limitations on the number of pixels controlled by one micro pixel controller 130, but an occasion when four pixels are controlled by one micro pixel controller 130 will be taken as an example for specific explanation.

As shown in FIG. 8, a plurality of pixel circuits 131 for controlling inorganic light emitting devices 120 that make up four pixels P1, P2, P3 and P4 may be arranged on a micro substrate 132 of the micro pixel controller 130. In the following embodiments, the micro substrate 132 will be referred to as a third substrate 132 to be distinguished from a module substrate 13 (see FIG. 19) and a package substrate 110 (see FIG. 9).

As many pixel circuits 131 as the number of the inorganic light emitting devices 120 controlled by the micro pixel controller 130 may be provided, or one pixel circuit 131 may control two or more inorganic light emitting devices 120.

The third substrate 132 may be implemented with one of various substrates of different materials, such as a silicon substrate, a glass substrate, a plastic substrate, a printed circuit board (PCB), a flexible printed circuit board (FPCB), a cavity substrate, etc. As there is no heated source such as the inorganic light emitting device in the micro pixel controller 130, any type of substrate may be selected without limitation for thermal resistance of ingredients.

A thin film transistor formed on the third substrate 132 may be a low temperature polycrystalline silicon (LTPS) thin film transistor or an oxide thin film transistor. It is also possible that the thin film transistor is a-Si thin film transistor or a monolithic thin film transistor. In the embodiment, an occasion when the thin film transistor is an LTPS thin film transistor will be taken as an example for specific explanation.

As described above, it is possible that the third substrate 132 is implemented with a silicon substrate. The silicon substrate has no restriction on electron mobility as compared with the glass substrate, so when the third substrate 132 is implemented with the silicon substrate, performance of the LTPS thin film transistor may be improved.

In the display module 10, circuit inspection may be performed for each micro pixel controller 130, and only the micro pixel controller 130 determined to be undefective from the circuit inspection may be mounted on the display module 10. This facilitates circuit inspection and replacement of a defective product as compared to an occasion when the thin film transistor circuit is mounted directly on the module substrate (first substrate as will be described later).

Figure 9:
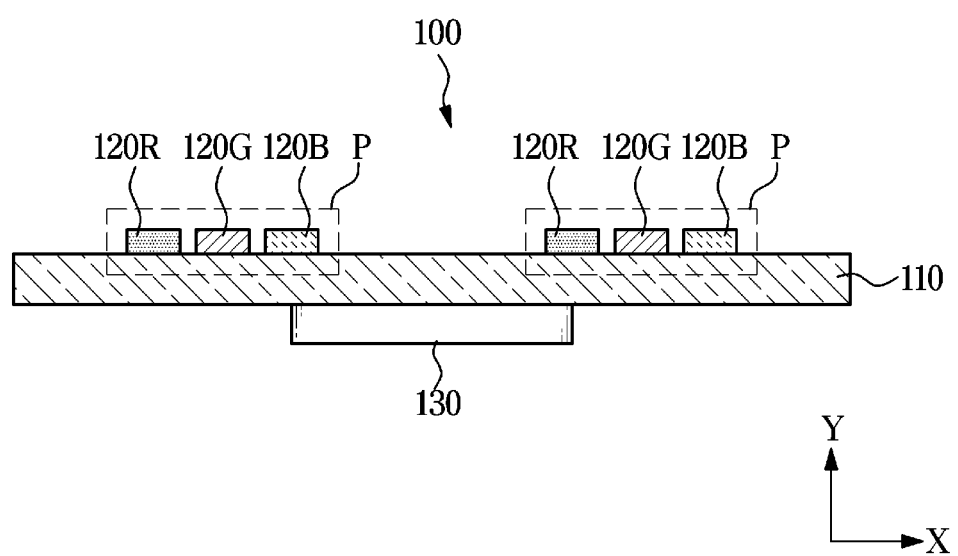
FIGS. 9 and 10 are side cross-sectional views of a micro pixel package included in a display module, according to an embodiment.
Figure 10:
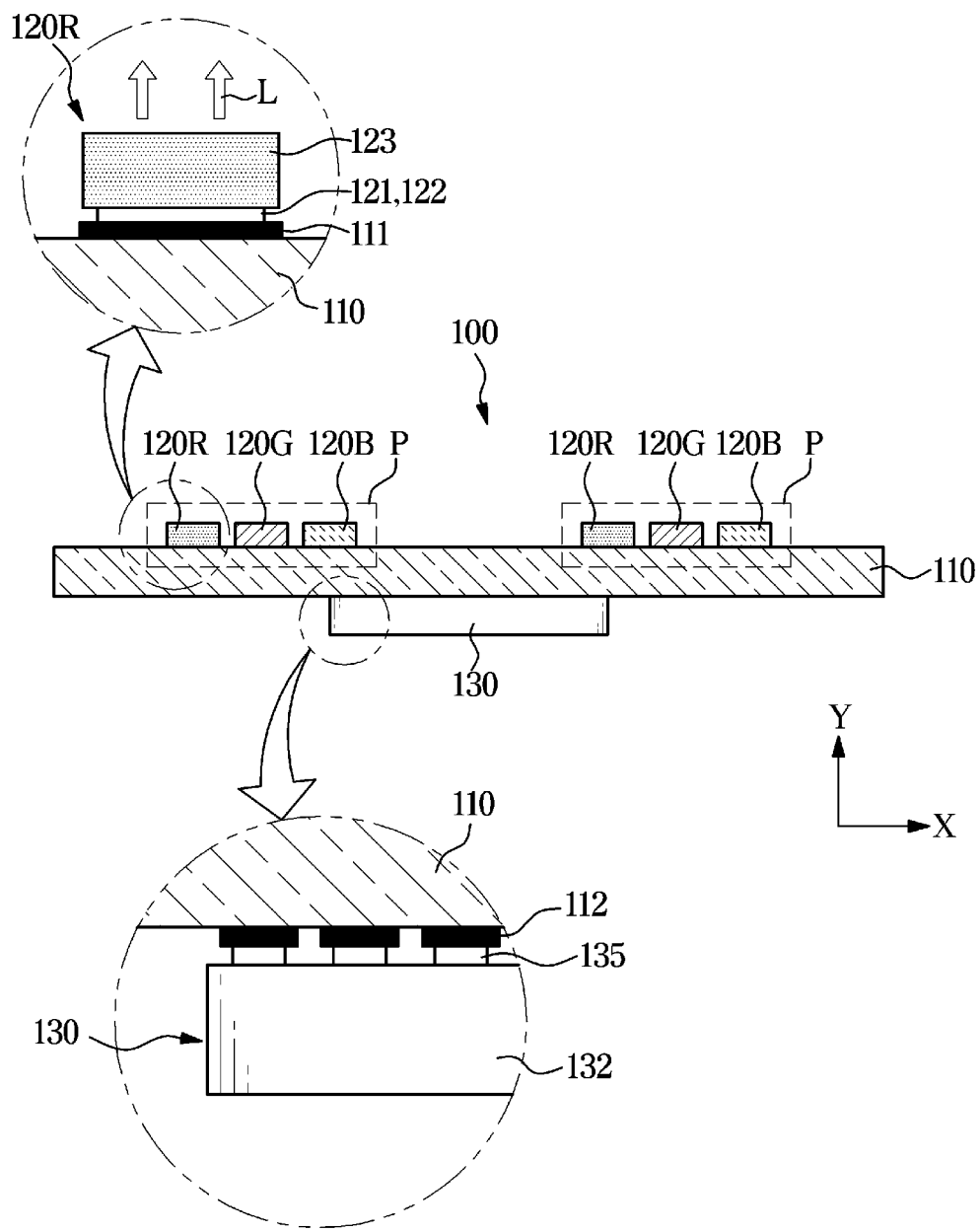

FIGS. 9 to 10 are side cross-sectional views of a micro pixel package included in a display module, according to an embodiment.

Referring to FIG. 9, the plurality of inorganic light emitting devices 120 may be arranged on the upper surface of the package substrate 110, and at least one micro pixel controller 130 for controlling the plurality of inorganic light emitting device 120 may be arranged on a lower surface of the package substrate 110. In the following embodiments, the package substrate 110 will be referred to as a second substrate 110 to be distinguished from other substrates.

The fact that a component is arranged on the upper surface or lower surface of another component may include not only an occasion when the component is arranged directly on the upper surface or lower surface of the other component but also an occasion when there is another layer or a third component arranged between the components.

In the display module 10 and the display device 1, there is no limitation on the number of the micro pixel controllers 130 included in one micro pixel package 100. For example, assuming that one micro pixel controller 130 controls four pixels, there may be four pixels and one micro pixel controller 130 for controlling the pixels arranged in one micro pixel package 100 as in the example of FIGS. 9 and 10, eight pixels and two micro pixel controllers 130 for controlling the pixels may be arranged therein, or twelve pixels and three micro pixel controllers 130 for controlling the pixels may be arranged therein.

The plurality of inorganic light emitting devices 120 may be electrically connected to the upper surface of the second substrate 110, and at least one micro pixel controller 130 may be electrically connected to the lower surface of the second substrate 110.

The second substrate 110 may be implemented with one of various substrates of different materials, such as a silicon substrate, a glass substrate, a plastic substrate, a PCB, an FPCB, a cavity substrate, etc. There is no limitation on the type of the second substrate 110, but an occasion when the second substrate 110 is implemented with a glass substrate will be taken as an example in the following embodiments for specific explanation.

In FIG. 10, of a plurality of inorganic light emitting devices 120R, 120G and 120B that make up one pixel P, the red inorganic light emitting device 120R is enlarged as an example and a portion of the micro pixel controller 130 is enlarged. Although only the red inorganic light emitting device 120R is enlarged for convenience of explanation, the other inorganic light emitting devices 120G and 120B may also be electrically connected to the second substrate 110 in the same manner.

Referring to FIG. 10, in this embodiment, the inorganic light emitting device 120 may have a flip chip structure in which a pair of electrodes 121 and 122 are arranged on an opposite surface from the light emitting surface of a diode 123.

The pair of electrodes 121 and 122 may include an anode 121 and a cathode 122. For example, the anode 121 and the cathode 122 may each be arranged at one end of the inorganic light emitting device 120 in a length direction (vertical direction). The diagram of FIG. 10 is viewed from a short side of the inorganic light emitting device 120, which shows only one electrode. The electrode shown may be the anode 121 or the cathode 122.

The inorganic light emitting device 120 may be arranged so that the light emitting surface faces upward (direction +Y), and the electrodes 121 and 122 arranged on the opposite surface from the light emitting surface may be electrically connected to an upper electrode pad 111 arranged on the upper surface of the second substrate 110.

The fact that two components are electrically connected may include not only an occasion when electrically conductive materials are directly soldered but also an occasion when the components are connected by an extra wire or with a conductive adhesive. There is no restriction on a specific connection method as long as a current flows between two components connected.

For example, when two components are to be soldered, Au—In bonding, Au—Sn bonding, Cu pillar/SnAg bump bonding, Ni pillar/SnAg bump bonding, SnAgCu, SnBi, or SnAg solder ball bonding, may be used.

When the conductive adhesive is used, a conductive adhesive such as an anisotropic conductive film (ACF), an anisotropic conductive paste (ACP), etc., may be arranged between the two components and pressure is applied thereto so that a current may flow in a direction in which the pressure is applied.

As described above, the pixel circuit 131 for switching and driving the inorganic light emitting device 120 may be provided on the extra third substrate 132 instead of the second substrate 110 to make up the micro pixel controller 130.

A connection pin 135 for electrical connection with the second substrate 110 may be provided on the upper surface of the third substrate 132, and the connection pin 135 may be electrically connected to a lower electrode pad 112 provided on the lower surface of the second substrate 110.

In the display module 10, circuit elements such as thin film transistors to switch and drive the plurality of inorganic light emitting device 120 are provided in the extra micro pixel controller 130 instead of the second substrate 110, which eliminates the need to form circuit elements such as the thin film transistors in addition to the electric pads 111 and 112 or the wires on the second substrate 110. Hence, the second substrate 110 may be implemented with a glass substrate having better durability against heat, and the second substrate 110 implemented even with the glass substrate does not affect performance of the thin film transistor.

This may prevent the circuit elements from being damaged in the course of cutting and wiring on the second substrate 110 or the module substrate (the first substrate as will be described later) or replacing the inorganic light emitting device 120, and may reduce the level of difficulty in manufacturing the display module 10.

As the micro pixel controller 130 is arranged on the lower surface of the second substrate 110, i.e., an opposite surface from the surface on which the inorganic light emitting device 120 is arranged, a problem of reduction in viewing angle caused by the micro pixel controller 130 hiding the inorganic light emitting device 120 from a side may be prevented.

Figure 11:
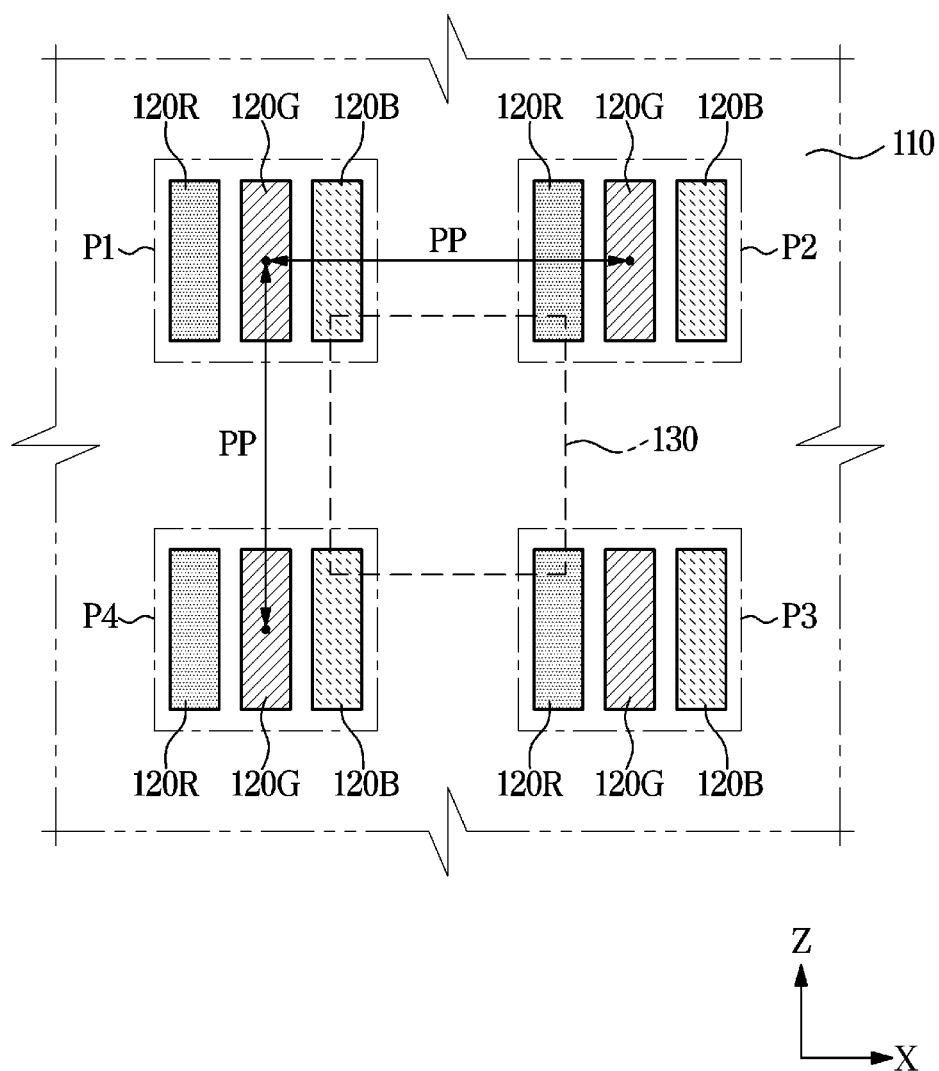
FIG. 11 is a top view of a micro pixel package included in a display module, according to an embodiment.
Figure 12:
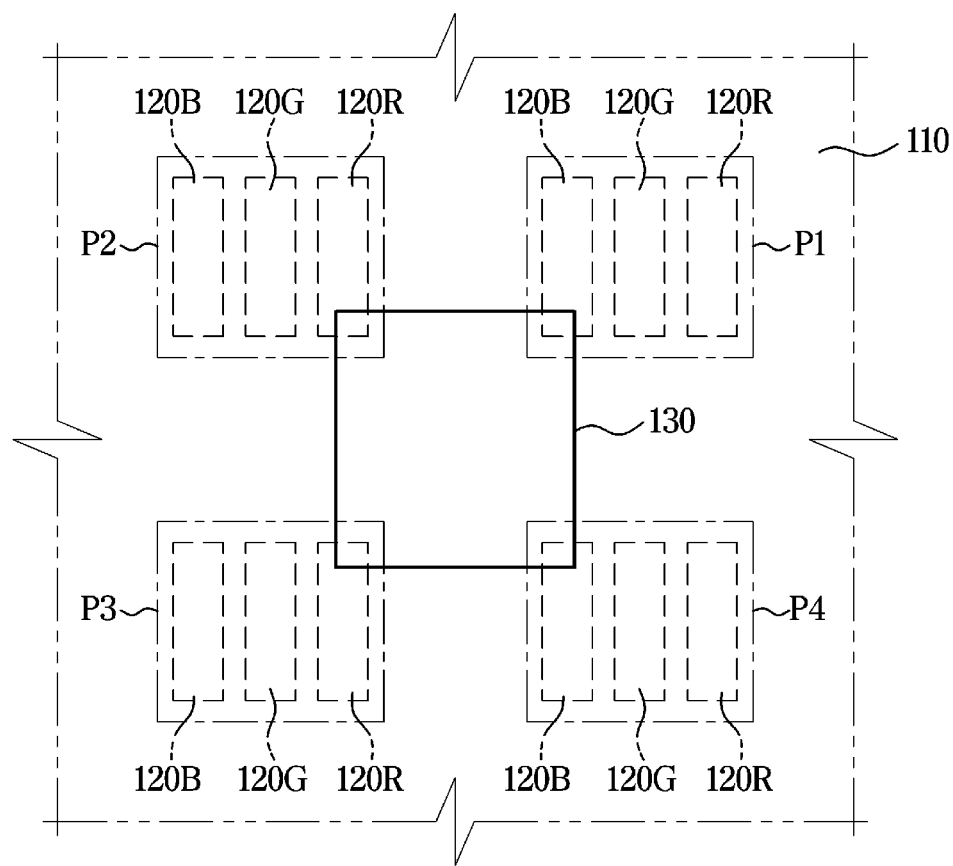
FIG. 12 is a bottom view of a micro pixel package included in a display module, according to an embodiment.

FIG. 11 is a top view of a micro pixel package included in a display module, according to an embodiment, and FIG. 12 is a bottom view of a micro pixel package included in a display module, according to an embodiment. For example, one micro pixel controller 130 may control pixels arranged in an array 2×n or an array n×2, where n is an integer equal to or greater than 1. Also, in FIGS. 11 and 12, an occasion when one micro pixel controller 130 controls four pixels P1, P2, P3 and P4 arranged in an array 2×2 is taken as an example.

Referring to FIGS. 11 and 12, as the micro pixel controller 130 is arranged on the lower surface of the second substrate 110, the position or size of the micro pixel controller 130 does not affect arrangement of the plurality of inorganic light emitting devices 120R, 120G and 120B on the upper surface of the second substrate 110. Furthermore, the micro pixel controller 130 may also be arranged in a desired position by being implemented in a desired size regardless of the space between the pixels P.

For example, even when the micro pixel controller 130 is larger in size than the space between the pixels P1, P2, P3 and P4, there is no need to increase the distance between the neighboring pixels, i.e., pixel interval (PP) and at least a portion of the micro pixel controller 130 and at least a portion of the pixels P1, P2, P3 and P4 may be arranged to overlap each other in the vertical direction (direction Y).

Specifically, when the micro pixel controller 130 is implemented in a rectangular parallelepiped with the upper surface and the lower surface having the shape of a rectangle, and the length of a short side of the upper surface or the lower surface is set to be longer than the distance between boundaries of the neighboring pixels P, the micro pixel controller 130 may be arranged without affecting the pixel interval PP. The distance between the boundaries of the neighboring pixels P may refer to a distance between those of the neighboring inorganic light emitting devices 120, which belong to different pixels P.

Accordingly, the pixel interval PP may be minimized without limitation from the micro pixel controller 130, and the minimized pixel interval PP may lead to realization of a high resolution in the same area. Furthermore, the micro pixel controller 130 may also be equipped with required parts without restriction on the size due to the pixel interval PP.

In addition, the pixel intervals PP from a pixel as a reference to the neighboring pixels located above, under, and to the left and right of the pixel may be the same. In the embodiment, the fact that some values are the same may include not only an occasion when the values are completely identical but also an occasion when the values are matched within a certain error range.

The pixel interval PP may be referred to as pixel pitch, and in the embodiment, the pixel interval PP is defined to represent a distance from a center of one pixel to a center of a neighboring pixel. Embodiments of the display module 10 are not, however, limited thereto, and the pixel interval PP may be defined otherwise.

According to what are shown in FIGS. 11 and 12, the micro pixel controller 130 may be arranged on the lower surface of the second substrate 110 at a position corresponding to the four pixels P1, P2, P3 and P4 controlled by the micro pixel controller 130. For example, the micro pixel controller 130 may be placed under an area including all the four pixels P1, P2, P3 and P4. Furthermore, the micro pixel controller 130 may be located in a position corresponding to the center of the area such that the center of the micro pixel controller 130 corresponds to the center of the area. In the embodiment, the fact that two components correspond to each other includes even an occasion when the two components are matched within a certain error range. When the micro pixel controller 130 is arranged in this manner, a wire length may be minimized when the inorganic light emitting device 120 and the micro pixel controller 130 that controls the inorganic light emitting device 120 are electrically connected through a vertical interconnect access (via) hole wire.

The arrangement of the micro pixel controller 130 shown in FIGS. 11 and 12 is merely an example that may be applied to the display module 10, and there may be various modifications on the number of pixels controlled by the micro pixel controller 130 and the position where the micro pixel controller 130 is arranged.

Figure 13:
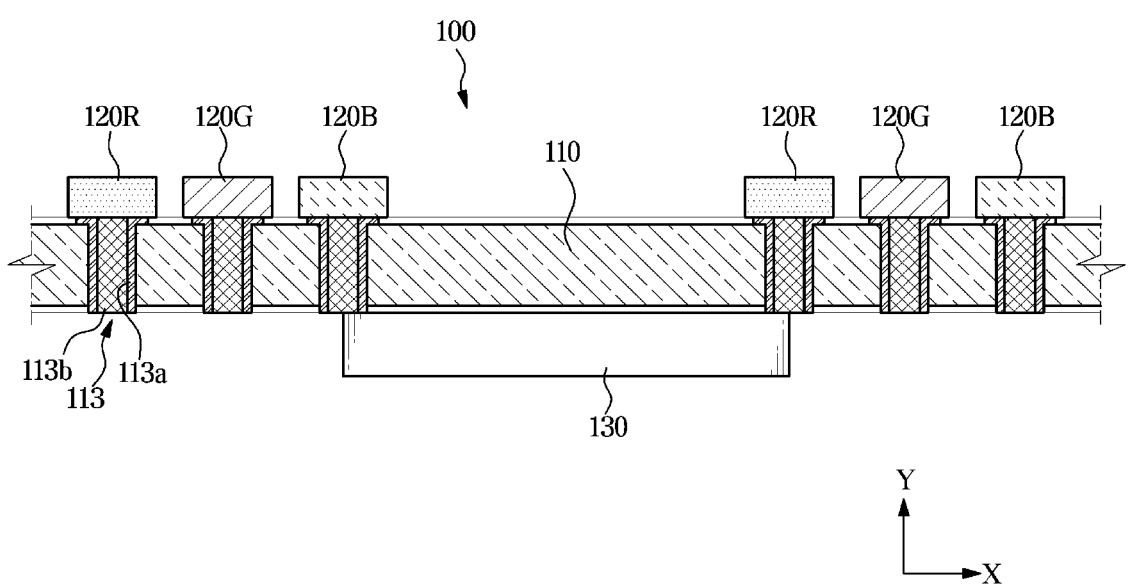
FIG. 13 is a side cross-sectional view of inorganic light emitting devices connected to a micro pixel controller through via holes in a display module, according to an embodiment.
Figure 14:
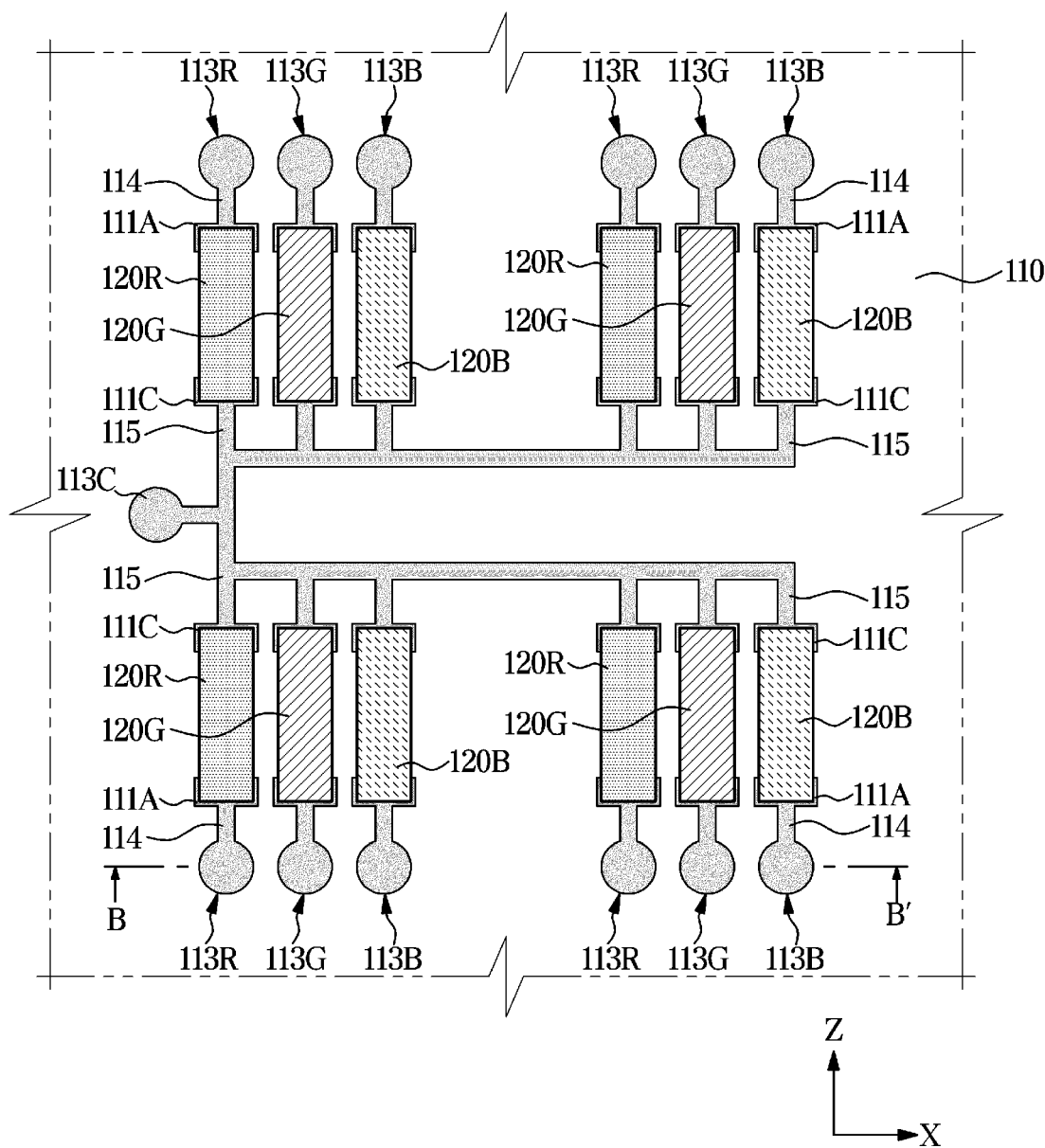
FIG. 14 is a top view of inorganic light emitting devices connected to a micro pixel controller through via holes in a display module, according to an embodiment.
Figure 15:
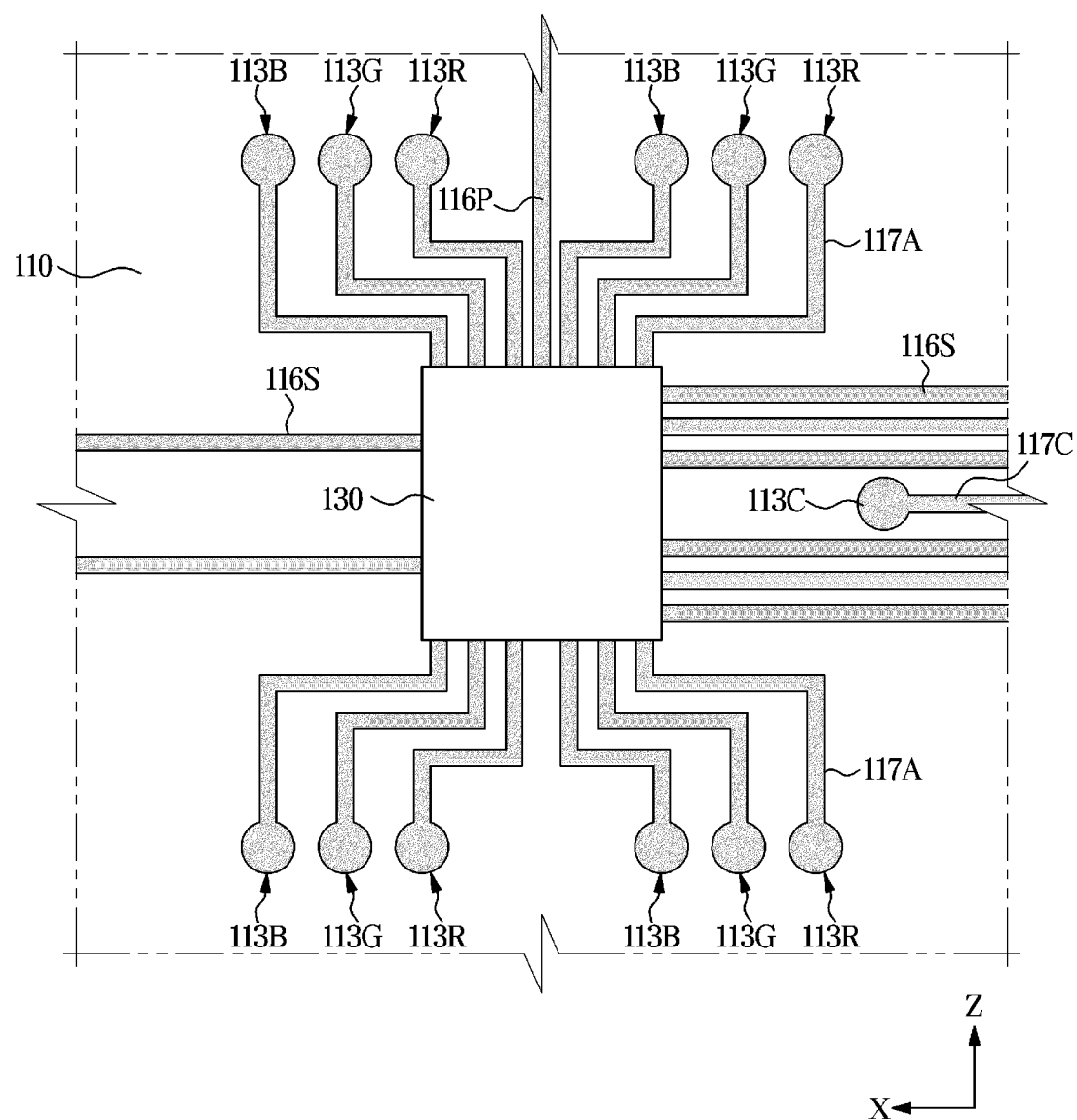
FIG. 15 is a bottom view of inorganic light emitting devices connected to a micro pixel controller through via holes in a display module, according to an embodiment.

FIG. 13 is a side cross-sectional view of inorganic light emitting devices connected to a micro pixel controller through via holes in a display module, according to an embodiment, FIG. 14 is a top view of inorganic light emitting devices connected to a micro pixel controller through via holes in a display module, according to an embodiment, and FIG. 15 is a bottom view of inorganic light emitting devices connected to a micro pixel controller through via holes in a display module, according to an embodiment. The side cross-section shown in FIG. 13 is a vertical cross-section along line B-B' of FIG. 14.

Referring to FIG. 13, as an example for electrically connecting the plurality of inorganic light emitting devices 120R, 120G and 120B arranged on the upper surface of the second substrate 110 to the micro pixel controller 130 arranged on the lower surface of the second substrate 110, a via hole based connection method may be employed.

When the second substrate 110 is a glass substrate, at least one via 113 may be formed to electrically connect the plurality of inorganic light emitting devices 120R, 120G and 120B arranged on the upper surface of the second substrate 110 to the micro pixel controller 130 arranged on the lower surface of the first substrate 120 by forming a via hole at the second substrate 110 by applying a through-glass via (TGV) technology, plating the inner wall of the via hole with a conductive material 113a such as copper and then filling the via hole with a filling material 113b through via filling.

The filling material 113b that may be filled in the via hole may be a conductive material or a non-conductive material. In embodiments that follow, the via 113 formed to pass through the second substrate 110 will be referred to as a via hole wire 113.

FIG. 14 illustrates an upper surface wiring structure of the second substrate 110. Referring to both FIGS. 13 and 14, a via hole wire 113R for electrically connecting the anode 121 of the red inorganic light emitting device 120R arranged on the upper surface of the second substrate 110 to the micro pixel controller 130 arranged on the lower surface of the second plate 110, a via hole wire 113G for electrically connecting the anode 121 of the green inorganic light emitting device 120G arranged on the upper surface of the second substrate 110 to the micro pixel controller 130 arranged on the lower surface of the second substrate 110, and a via hole wire 113B for electrically connecting the anode 121 of the blue inorganic light emitting device 120B arranged on the upper surface of the second substrate 110 to the micro pixel controller 130 arranged on the lower surface of the second plate 110 may be formed to penetrate the second substrate 110.

An anode pad 111A connected to the anode 121 of each inorganic light emitting device 120 among the upper electrode pads 111 formed on the upper surface of the second substrate 110 may be connected to the via hole wire 113R, 113G, or 113B by an anode wire 114 of the upper wires of the first substrate 110.

A common reference voltage $V_{SS}$ may be applied to the cathodes 122 of the plurality of inorganic light emitting devices 120R, 120G and 120B. A via hole wire 113C for applying the common reference voltage $V_{SS}$ to the cathodes 122 may be formed on the second substrate 110, and cathode pads 111C connected to the cathodes 122 of the inorganic light emitting devices 120 may be connected to the via hole wire 113C by cathode wires 115 of the upper wires of the second substrate 110.

FIG. 15 illustrates a lower surface wiring structure of the second substrate 110. Referring to FIG. 15, the via hole wires passing through the second substrate 110 may be electrically connected to the micro pixel controller 130 or an FPCB for supplying power through lower wires formed on the lower surface of the second substrate 110.

Specifically, the via hole wires 113R, 113G and 113B connected to the anodes 121 of the inorganic light emitting devices 120R, 120G and 120B may be electrically connected to the micro pixel controller 130 through lower wires 117A.

The driving current $C_D$ output from the micro pixel controller 130 may be applied to the anodes 121 of the inorganic light emitting devices 120R, 120G and 120B through the lower wires 117A, the via hole wires 113R, 113G and 113B and the anode wires 114.

The via hole wire 113C connected to the cathodes 122 of the inorganic light emitting devices 120R, 120G and 120B may be electrically connected to the FPCB for supplying power through a lower wire 117C to apply the reference voltage $V_{SS}$ to the inorganic light emitting devices 120R, 120G and 120B.

A lower wire 116S for applying a gate signal and a data signal and a lower wire 116P for applying a power voltage $V_{DD}$ to the micro pixel controller 130 may be formed on the lower surface of the second substrate 110.

The wiring structure shown in FIGS. 13 to 15 is merely an example that may be applied to the display module 10. It is thus obvious that various wiring structures in addition to the aforementioned wiring structure may be applied to embodiments of the display module 10.

As another example for electrically connecting the plurality of inorganic light emitting devices 120R, 120G and 120B arranged on the upper surface of the second substrate 110 to the micro pixel controller 130 arranged on the lower surface of the second substrate 110, a side wiring based connection method may be employed.

Figure 16:
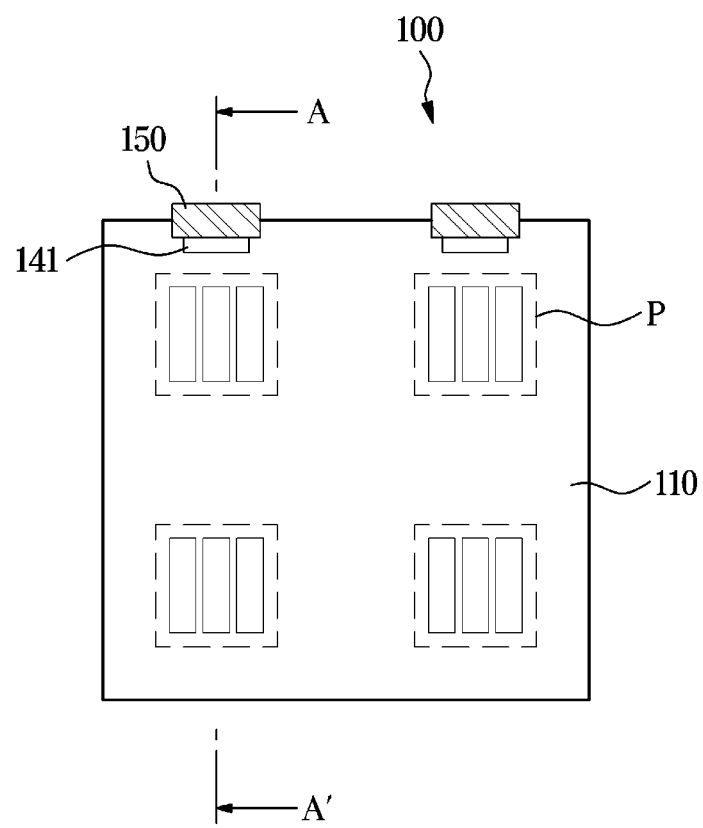
FIG. 16 is a top view of inorganic light emitting devices connected to a micro pixel controller through a side wire in a display module, according to an embodiment.
Figure 17:
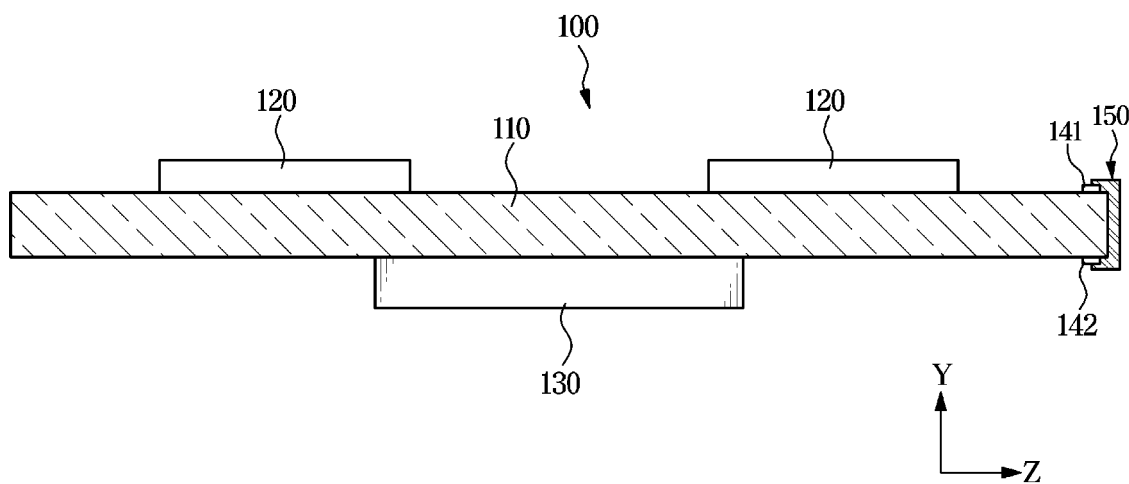
FIG. 17 is a side cross-sectional view of inorganic light emitting devices connected to a micro pixel controller through a side wire in a display module, according to an embodiment.
Figure 18:
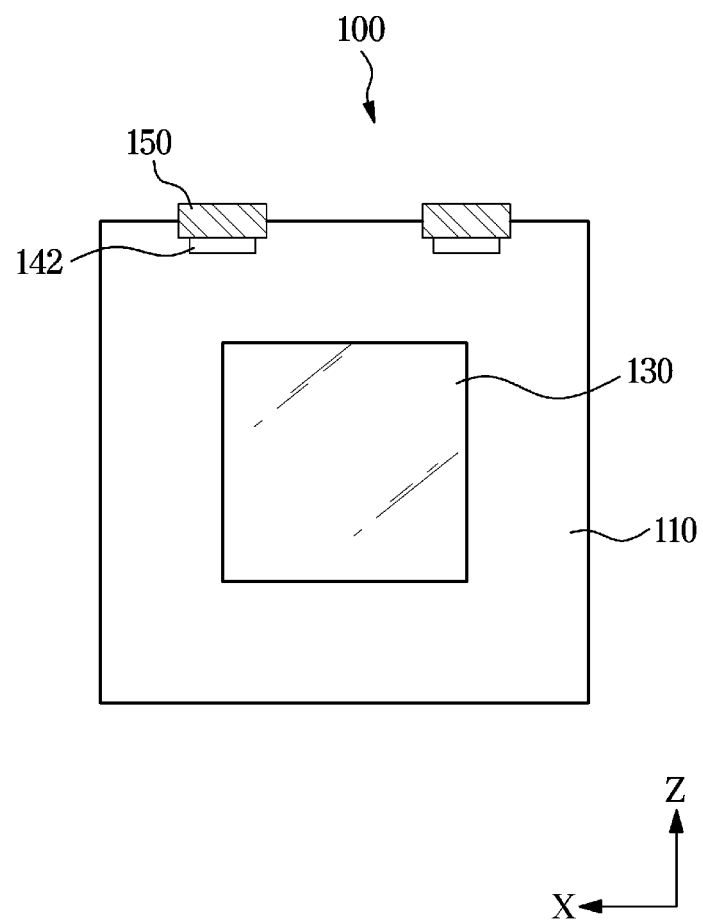
FIG. 18 is a bottom view of inorganic light emitting devices connected to a micro pixel controller through a side wire in a display module, according to an embodiment.

FIG. 16 is a top view of inorganic light emitting devices connected to a micro pixel controller through side wires in a display module, according to an embodiment, FIG. 17 is a side cross-sectional view of inorganic light emitting devices connected to a micro pixel controller through side wires in a display module, according to an embodiment, and FIG. 18 is a bottom view of inorganic light emitting devices connected to a micro pixel controller through side wires in a display module, according to an embodiment. The side cross-section shown in FIG. 17 is a vertical cross-section along line A-A' of FIG. 16.

Referring to FIGS. 16 to 18 together, a side wire 150 may be formed on one side of the second substrate 110 to connect the upper wire to the lower wire of the second substrate 110. Only two side wires 150 are shown for convenience of explanation, but it is obvious that the number of side wires 150 formed on one micro pixel package 100 may be changed depending on the design.

A plurality of upper connection pads 141 may be arranged in an upper surface edge area of the second substrate 110, and a plurality of lower connection pads 142 may be arranged in a lower surface edge area.

For example, referring to the side cross-sectional view of FIG. 17, the side wire 150 may be arranged in such a form that covers at least a portion of the upper connection pad 141, the side of the second substrate 110, and at least a portion of the lower connection pad 142 to electrically connect the upper connection pad 141 to the lower connection pad 142.

Although not shown, the upper wire extending from each pixel P may be electrically connected to the side wire 150 through the upper connection pad 141, and the lower wire extending from the micro pixel controller 130 may be electrically connected to the side wire 150 through the lower connection pad 142.

The plurality of inorganic light emitting devices 120 arranged on the upper surface of the second substrate 110 may be electrically connected to the micro pixel controller 130 arranged on the lower surface of the second substrate 110 through the upper wire, the upper connection pad 141, the side wire 150, the lower connection pad 142 and the lower wire.

Specifically, the anode 121 of the inorganic light emitting device 120 may receive a driving current $C_D$ from the micro pixel controller 130 through the side wire 150, and the cathode 122 of the inorganic light emitting device 120 may receive a reference voltage $V_{SS}$ from the FPCB for supplying power through the side wire 150.

The side wire 150 may be formed in a method that applies a conductive material to a side surface of the second substrate 110, and the method that applies the conductive material may employ one of various methods such as an ink-jet method, a stamping method, a screen printing method, a metal deposition method, a tape based adhesion method, an etching method, etc.

The micro pixel package 100 in the aforementioned structure may be provided in the plural to implement one display module 10. By making a decision on whether the inorganic light emitting device 120 is defective or undefective for each micro pixel package 100 and having only undefective micro pixel packages 100 mounted on the display module 10, the reliability of inspection may be increased and defective products may be easily replaced.

Figure 19:
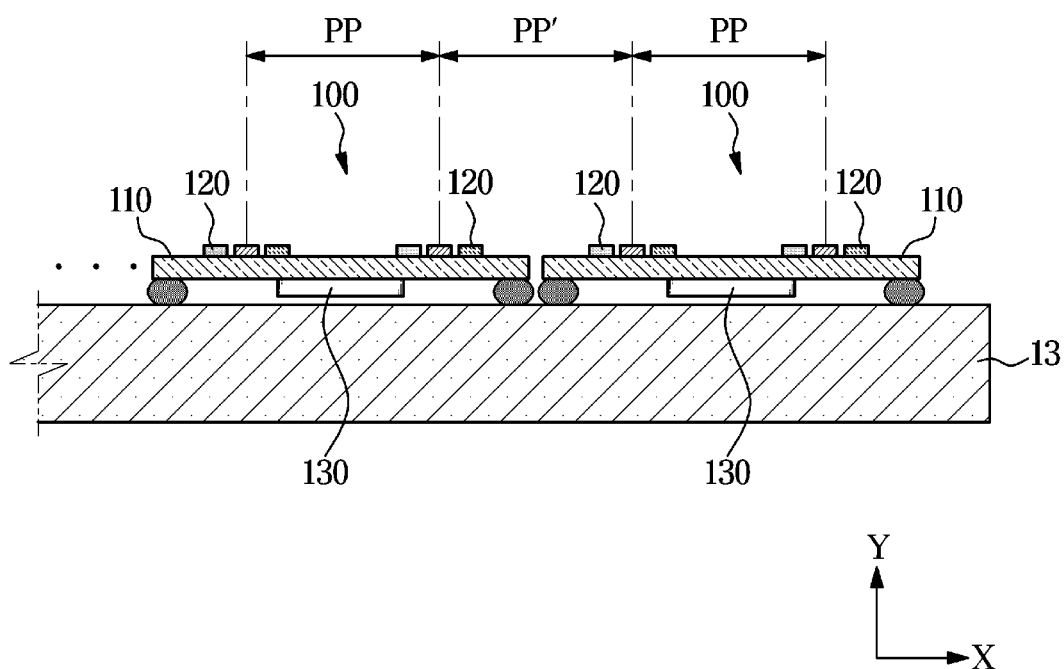
FIG. 19 is a side cross-sectional view of a module substrate on which micro pixel packages are arranged in a display module, according to an embodiment.
Figure 20:
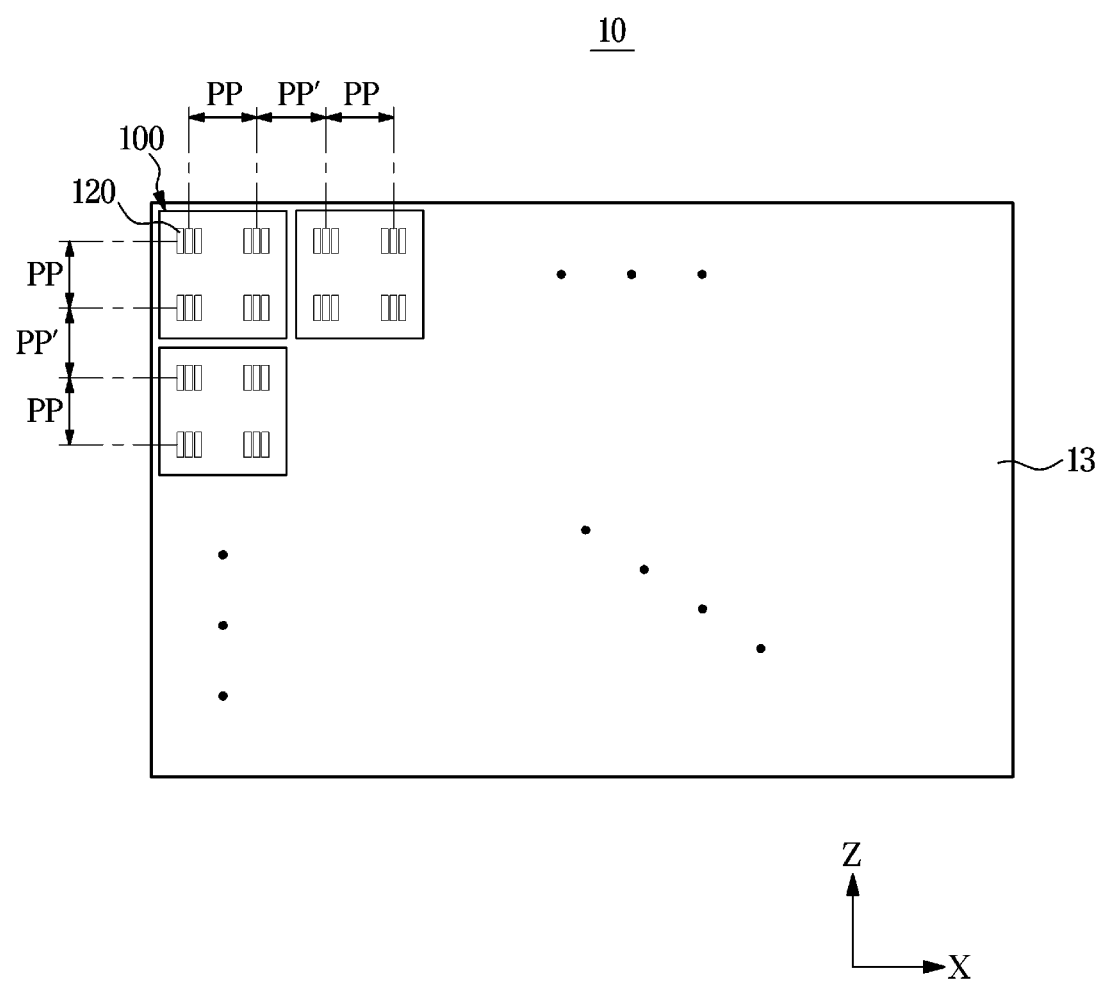
FIG. 20 is a top view of a module substrate on which micro pixel packages are arranged in a display module, according to an embodiment.

FIG. 19 is a side cross-sectional view of a module substrate on which micro pixel packages are arranged in a display module, according to an embodiment, and FIG. 20 is a top view of a module substrate on which micro pixel packages are arranged in a display module, according to an embodiment.

The micro pixel package 100 as described above with reference to FIGS. 9 to 18 may be arranged on the upper surface of the module substrate 13 as shown in FIGS. 19 and 20. In the embodiments that follow, the module substrate will be referred to as a first substrate.

The first substrate 13 may be implemented with one of various substrates of different materials, such as a silicon substrate, a glass substrate, a plastic substrate, a PCB, an FPCB, a cavity substrate, etc. As the inorganic light emitting device 120 or a thin film transistor circuit is not mounted directly on the first substrate 13, a type of the first substrate 13 may be selected by taking easiness, efficiency, expenses, etc., of the manufacturing process into account.

As described above, as the plurality of inorganic light emitting devices 120 are arranged on the upper surface of the second substrate 110 of the micro pixel package 100, the micro pixel package 100 may be arranged such that the lower surface of the second substrate 110 faces the first substrate 13 and the upper surface faces upward (direction +Y).

The micro pixel package 100 may be arranged by considering the whole pixel array and pixel pitch of the display module 10. For example, when the display module 10 has a pixel array of a matrix M×N and the inorganic light emitting devices 120 are arranged in a pixel array of a matrix m×n in the micro pixel package 100, M or m micro pixel packages 100 may be arranged in columns, i.e., along the Z-axis and N or n micro pixel packages 100 may be arranged in rows, i.e., along the X-axis.

As described above with reference to FIGS. 11 and 12, pixel intervals PP from one pixel as a reference to neighboring pixels above, under, to the left and right of the one pixel may all be the same in the micro pixel package 100. The pixel intervals PP may also be the same in a unit of the display module 10.

As shown in FIG. 20, the layout and interval of the micro pixel packages 100 may be determined such that even when two neighboring pixels P are placed in different micro pixel packages 100, a pixel interval PP' between the two pixels is the same as the pixel interval PP within one micro pixel package 100.

Figure 21:
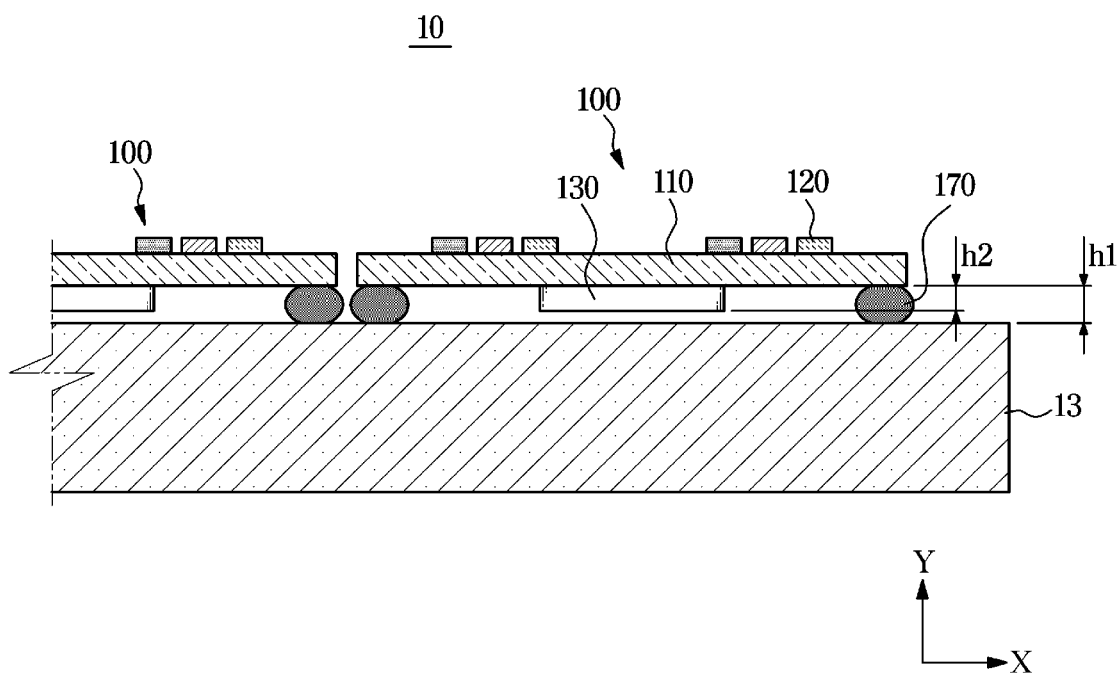
FIGS. 21 and 22 illustrate how micro pixel packages are connected to a module substrate in a display module, according to an embodiment.
Figure 22:
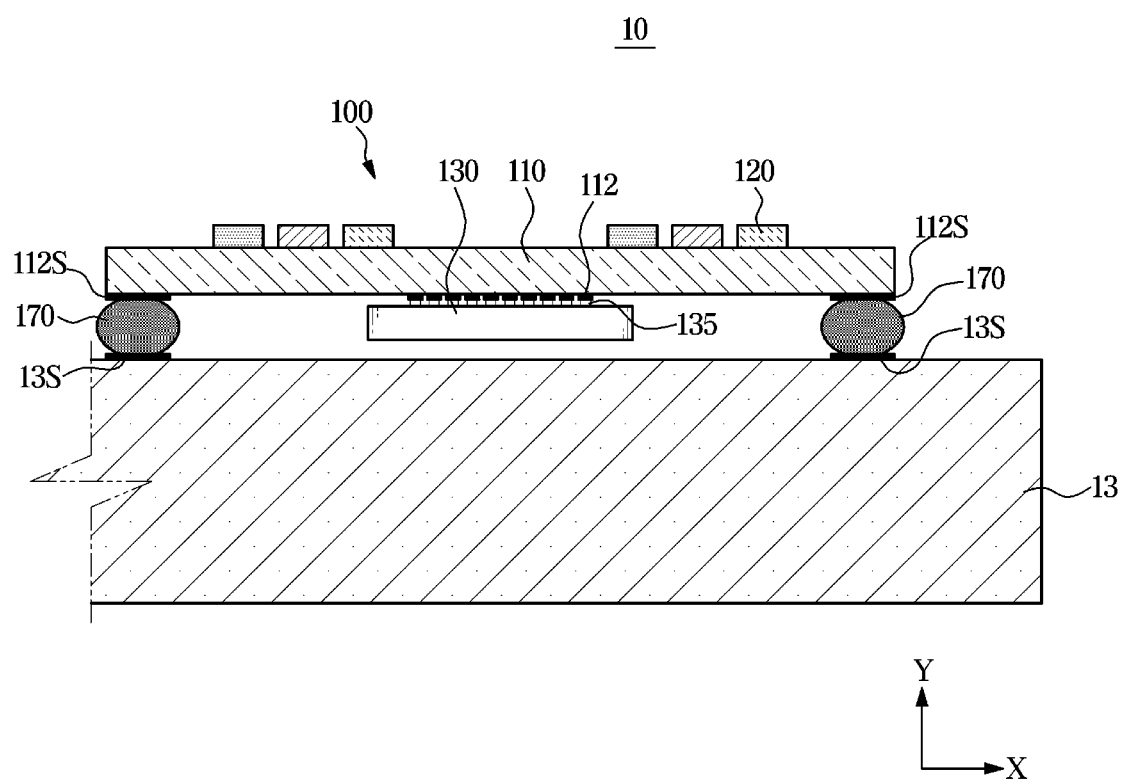

FIGS. 21 and 22 illustrate how micro pixel packages are connected onto a module substrate in a display module, according to an embodiment.

Referring to FIG. 21, the micro pixel package 100 may be electrically connected to the first substrate 13 by a solder ball based ball grid array (BGA) soldering method. For this, at least one solder ball 170 may be used for each micro pixel package 100.

Height h1 or a diameter of the solder ball 170 may be determined based on height h2 or thickness of the micro pixel controller 130 mounted at the bottom of the micro pixel controller 130. Specifically, the height h1 of the solder ball 170 may be set to be greater than the height h2 of the micro pixel controller 130 to prevent the micro pixel controller 130 from touching the first substrate 13 and being damaged or prevent the micro pixel package 100 and the first substrate 13 from making wrong connection.

Referring to FIG. 22, for connection based on the solder ball 170, a plurality of first soldering pads 13S may be provided on the upper surface of the first substrate 13, and a plurality of second soldering pads 112S may be provided on the lower surface of the second substrate 110. The solder ball 170 may be arranged between the first soldering pad 13S and the second soldering pad 112S.

When the micro pixel package 100 is electrically connected to the first substrate 13 through the solder ball 170, a signal or power sent from the first substrate 13 may be input to the micro pixel controller 130 or the inorganic light emitting device 120 through the first soldering pad 13S, the solder ball 170, and the second soldering pad 112S.

In determining the height h1 of the solder ball 170, thickness of the first soldering pad 13S and the second soldering pad 13S located above and under the solder ball 170 may be taken into account in the soldering, and thickness of the connection pin 135 and the lower electrode pad 112 used to electrically connect the micro pixel controller 130 to the second substrate 110 may also be taken into account. In other words, the height of the solder ball 170 or heights of the other components may be determined such that a full height of when the first soldering pad 13S, the second soldering pad 112S and the solder ball 170 are electrically connected to each other is greater than a full height of when the lower electrode pad 112, the connection pin 135 and the micro pixel controller 130 are electrically connected to each other.

As the inorganic light emitting device 120 and the micro pixel controller 130 for controlling the inorganic light emitting device 120 are all mounted in the micro pixel package 100 arranged on the upper surface of the first substrate 13 in the display module 10 in an embodiment, there is no need for complicated wiring for connection between the inorganic light emitting device 120 and the thin film transistor for controlling the inorganic light emitting device 120 except the wiring for connection to the FPCB on the lower surface of the first substrate 13. This makes it easy to perform a wiring process on the module substrate.

Figure 23:
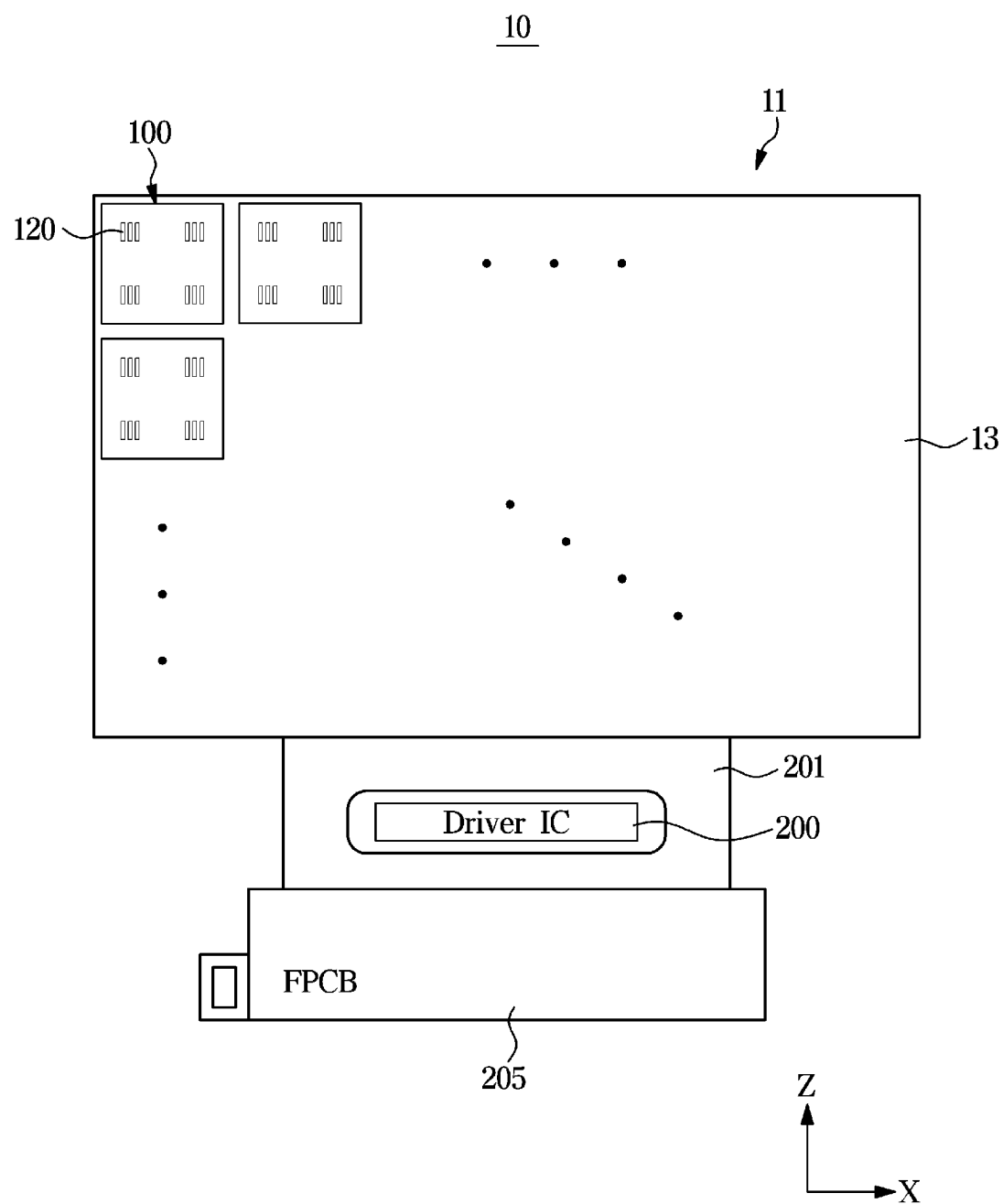
FIG. 23 illustrates how a display panel is electrically connected to a driver integrated circuit (IC) in a display module, according to an embodiment.
Figure 24:
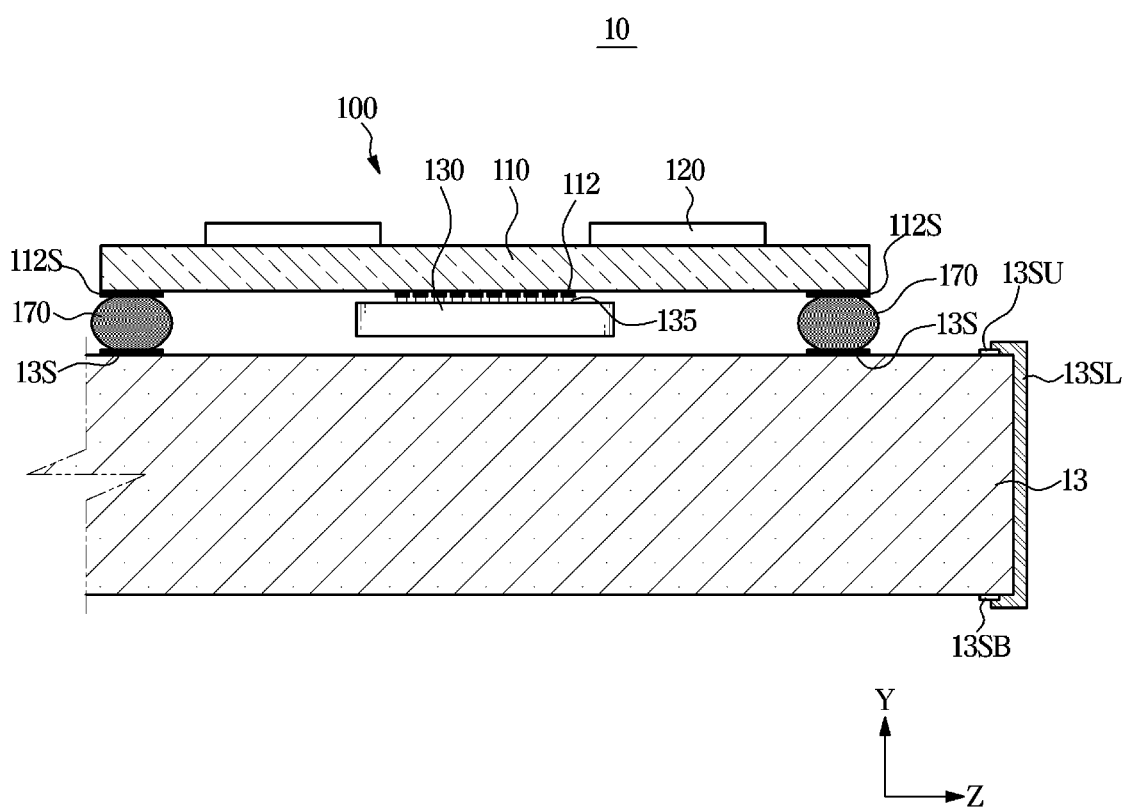
FIG. 24 is a side cross-sectional view illustrating an occasion when an upper wire and a lower wire are connected by a side wire in a module substrate of a display module, according to an embodiment.
Figure 25:
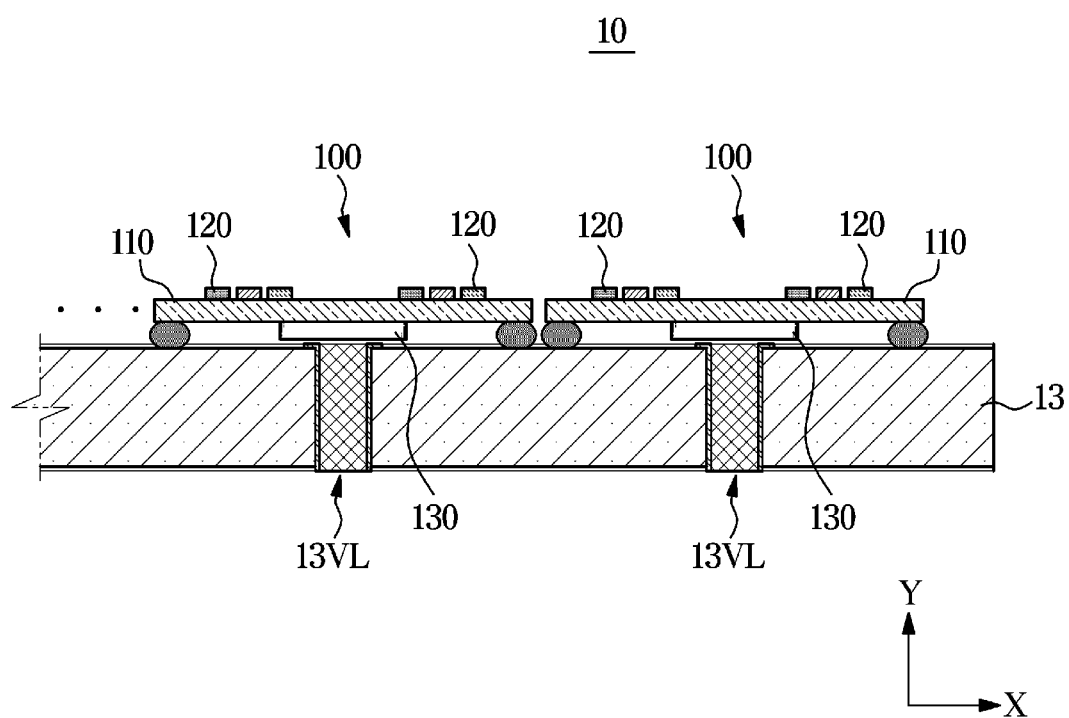
FIG. 25 is a side cross-sectional view illustrating an occasion when an upper wire and a lower wire are connected by a vertical interconnect access (via) hole wire in a module substrate of a display module, according to an embodiment.

FIG. 23 illustrates how a display panel is electrically connected to a driver IC in a display module, according to an embodiment, FIG. 24 is a side cross-sectional view illustrating an occasion when an upper wire and a lower wire are connected by a side wire in a module substrate of a display module, according to an embodiment, and FIG. 25 is a side cross-sectional view illustrating an occasion when an upper wire and a lower wire are connected by a via hole wire in a module substrate of a display module, according to an embodiment.

As described above, the micro pixel controller 130 arranged in the micro pixel package 100 may control the inorganic light emitting device 120 according to a driving signal supplied from the driver IC 200.

The driver IC 200 may be electrically connected to the display panel 11 by employing one of various bonding methods such as a chip on film (COF) or film on glass (FOG) bonding, a chip on glass (COG) bonding, a tape automated bonding (TAB), etc.

For example, when the COF bonding is employed, as shown in FIG. 23, the driver IC 200 may be mounted on a film 201 and the film 201 on which the driver IC 200 is mounted may have one end electrically connected to the first substrate 13 and the other end electrically connected to an FPCB 205. To electrically connect the film 201 and the first substrate 13, the film 201 may be connected to the lower electrode pad arranged on the lower surface of the first substrate 13.

Side wiring or via hole wiring may be used to send the signal supplied from the driver IC 200 to the micro pixel package 100 arranged on the upper surface of the first substrate 13.

When the side wiring is used, as shown in FIG. 24, an upper connection pad 13SU arranged on the upper surface of the first substrate 13 and a lower connection pad 13SB arranged on the lower surface of the first substrate 13 may be electrically connected by a side wire 13SL.

Although not shown, the upper wire formed on the upper surface of the first substrate 13 may extend from the first soldering pad 13S to be electrically connected to the side wire 150 through the upper connection pad 13SU. The lower wire formed on the lower surface of the first substrate 13 may extend from the lower electrode pad, to which the film 201 is connected, to be electrically connected to the side wire 13SL through the lower connection pad 13SB.

For example, the micro pixel package 100 arranged on the upper surface of the first substrate 13 may receive a driving signal from the driver IC 200 through the upper wire formed on the upper surface of the first substrate 13, the upper connection pad 13SU, the side wire 13SL, the lower connection pad 13SB and the lower wire formed on the lower surface of the first substrate 13.

Specifically, the anode 121 of the inorganic light emitting device 120 may receive a driving current $C_D$ from the micro pixel controller 130 through the side wire 150, and the cathode 122 of the inorganic light emitting device 120 may receive the reference voltage $V_{SS}$ from the FPCB for supplying power through the side wire 150.

When the via hole wire is used, as shown in FIG. 25, a plurality of via hole wires 13VL that pass through the first substrate 13 may be formed, and the micro pixel package 100 arranged on the upper surface of the first substrate 13 and the driver IC 200 may be electrically connected through the plurality of via hole wires 13VL.

For example, the micro pixel package 100 arranged on the upper surface of the first substrate 13 may receive a driving signal from the driver IC 200 and power through the upper wire formed on the upper surface of the first substrate 13, the via hole wire 13VL, and the lower wire formed on the lower surface of the first substrate 13.

The supplying of signals and power in the micro pixel package 100 may be performed by the via hole wire 113 or the side wire 150 as described above.

Figure 26:
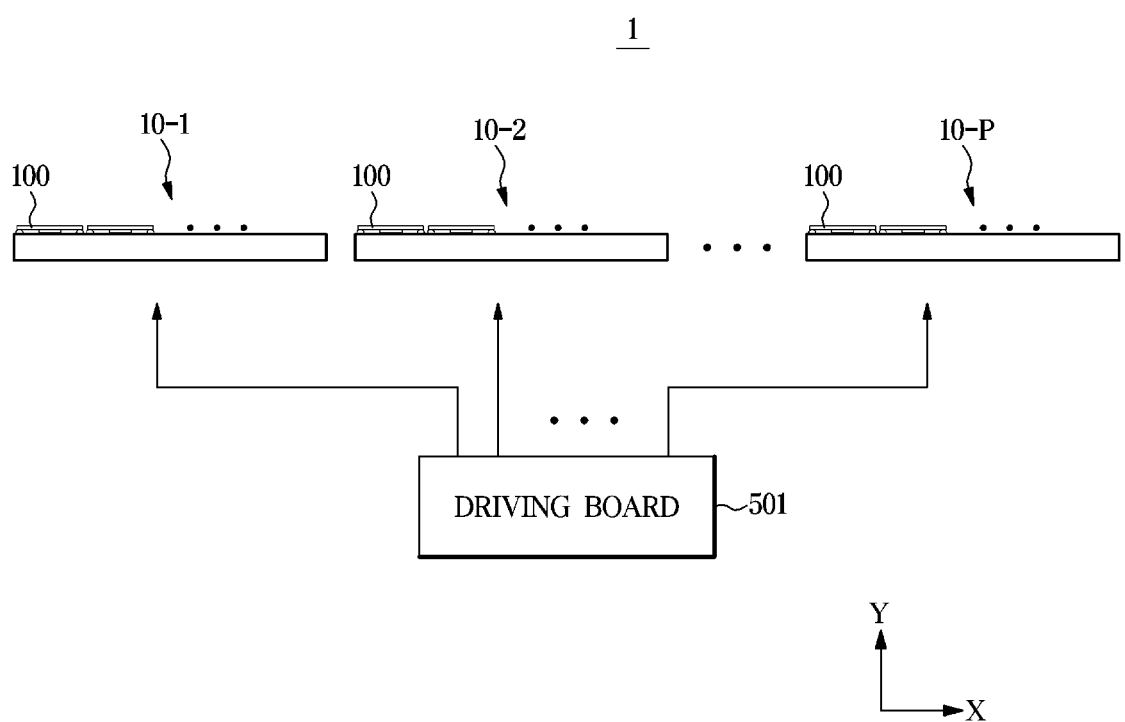
FIGS. 26 and 27 illustrate signals sent to a plurality of tiled display modules of a display device, according to an embodiment.
Figure 27:
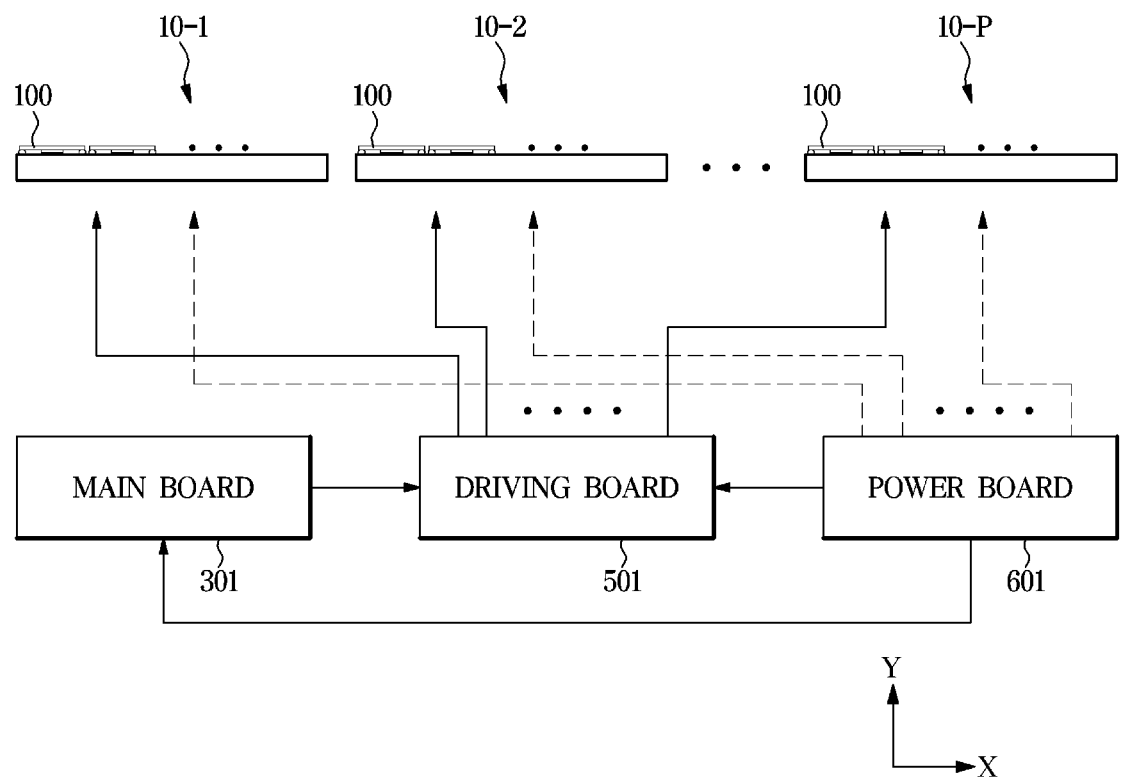

FIGS. 26 and 27 illustrate signals sent to a plurality of tiled display modules of a display device, according to an embodiment.

As described above, the plurality of display modules 10-1, 10-2, . . . , and 10-*n* may be tiled to implement the display device 1 having a large-area screen. As FIGS. 26 and 27 show the display device 1 on the plane XY, although the display modules 10-1, 10-2, . . . , 10-*n* just appear in one dimensional array, it is obvious that the plurality of display modules 10-1, 10-2, . . . , and 10-*n* may be arranged in 2D as described above with reference to FIG. 1.

As described above, the display panel 11 may be connected to the FPCB 205 through the film 201 on which the driver IC 200 is mounted. The FPCB 205 may be connected to a driving board 501 to electrically connect the display module 10 to the driving board 501.

The timing controller 500 may be arranged on the driving board 501. Hence, the driving board 501 may also be referred to as a T-con board. The plurality of display modules 10-1, 10-2, . . . , and 10-*n* may receive image data, a timing control signal, etc., from the driving board 501.

Referring to FIG. 27, the display device 1 may further include a main board 301 and a power board 601. The aforementioned main controller 300 may be provided on the main board 301, and a power circuit required to supply power to the plurality of display modules 10-1, 10-2, . . . , and 10-*n* may be provided on the power board 601.

The power board 601 may be electrically connected to the plurality of display modules 10-1, 10-2, . . . , and 10-*n* through the FPCB, and may apply the power voltage $V_{DD}$, the reference voltage $V_{SS}$, etc., to the plurality of display modules 10-1, 10-2, . . . , and 10-*n* connected through the FPCB.

For example, the power voltage $V_{DD}$ applied from the power board 601 may be applied to the micro controller 130 arranged on the lower surface of the micro pixel package 100 through the via hole wire 13VL or the side wire 13SL formed on the first substrate 13. The reference voltage $V_{SS}$ applied from the power board 601 may be applied to the inorganic light emitting device 120 arranged on the upper surface of the second substrate 110 through the via hole wire 13VL or the side wire 13SL formed on the first substrate 13 and the side wire 150 or the via hole wire 113 formed at the second substrate 110.

Although the plurality of display modules 10-1, 10-2, . . . , and 10-*n* are described in the aforementioned example as sharing the driving board 501, it is also possible that a separate driving board 501 is connected to each display module 10. Alternatively, it is also possible to group the plurality of display modules 10-1, 10-2, . . . , and 10-*n* and connect one driving board 501 to each group.

Figure 28:
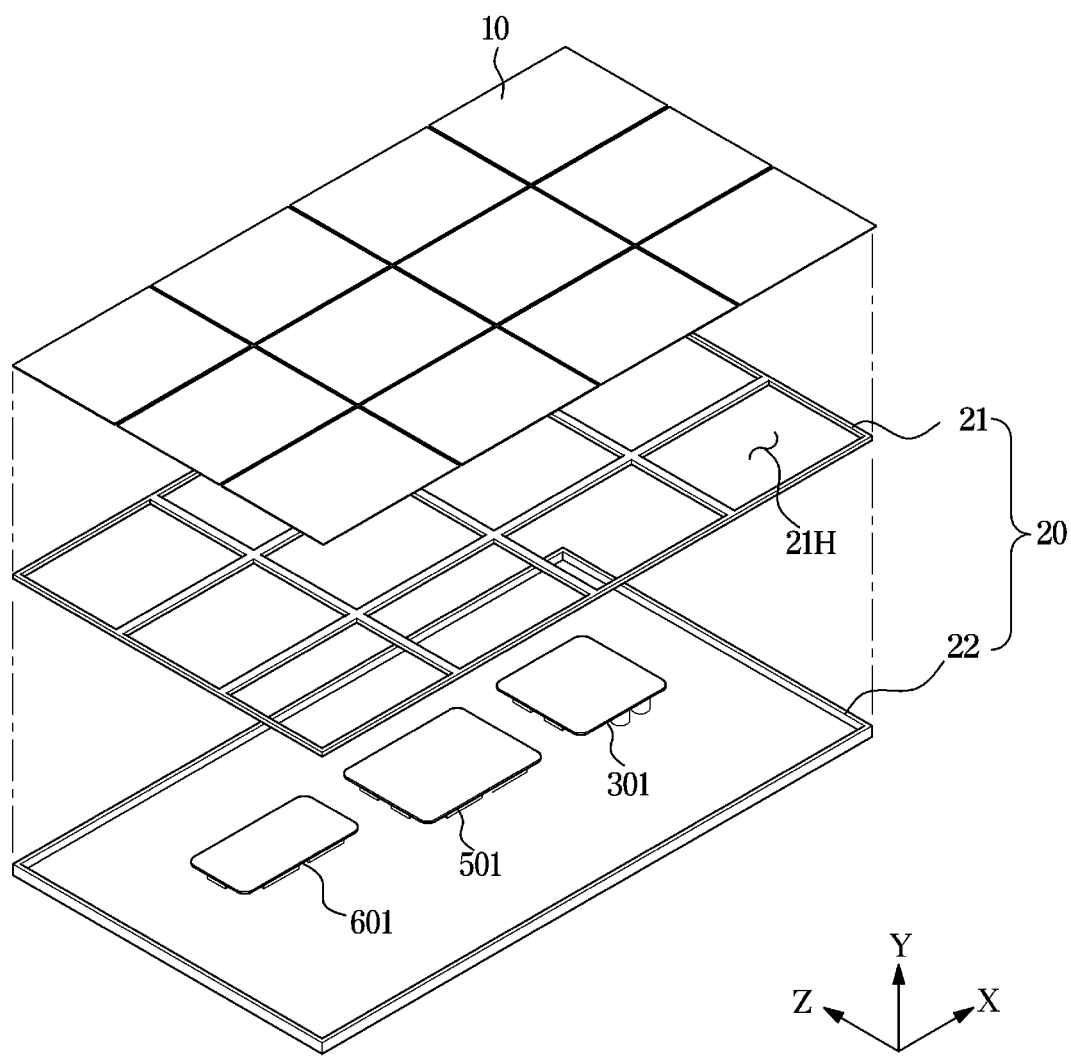
FIG. 28 illustrates an example of a method in which a plurality of display modules are coupled to a housing in a display device, according to an embodiment.

FIG. 28 illustrates an example of a method in which a plurality of display modules are coupled to a housing in a display device, according to an embodiment.

As described above, the plurality of display modules 10 may be arranged in the form of a 2D matrix and fixed to the housing 20. Referring to the example of FIG. 28, the plurality of display modules 10 may be installed on a frame 21 located under them, and the frame 21 may have a 2D mesh structure with some regions corresponding to the plurality of display modules 10 open.

Specifically, as many openings 21H as the number of the display modules 10 may be formed at the frame 21, and the openings 21H may have the same layout as the plurality of display modules 10.

Each of the plurality of display modules 10 may have bottom edge areas mounted on the frame 21. The bottom edge areas may have no circuit element nor wire formed therein.

The plurality of display modules 10 may be mounted on the frame 21 in a method that uses magnetic force of a magnet, coupling by a mechanical mechanism, or adhesion by an adhesive. There are no limitations on how the display module 10 is mounted on the frame 21.

The driving board 501, the main board 301 and the power board 601 may be arranged under the frame 21, and electrically connected to the plurality of display modules 10 through the openings 21H formed at the frame 21.

A bottom cover 22 may be coupled to the bottom of the frame 21, and the bottom cover 22 may form a bottom exterior of the display device 1.

The display modules 10 are arranged in 2D in the aforementioned example, but it is obvious that the display modules 10 may be arranged in 1D, in which case the structure of the frame 21 may also be modified into a 1D mesh structure.

Figure 29:
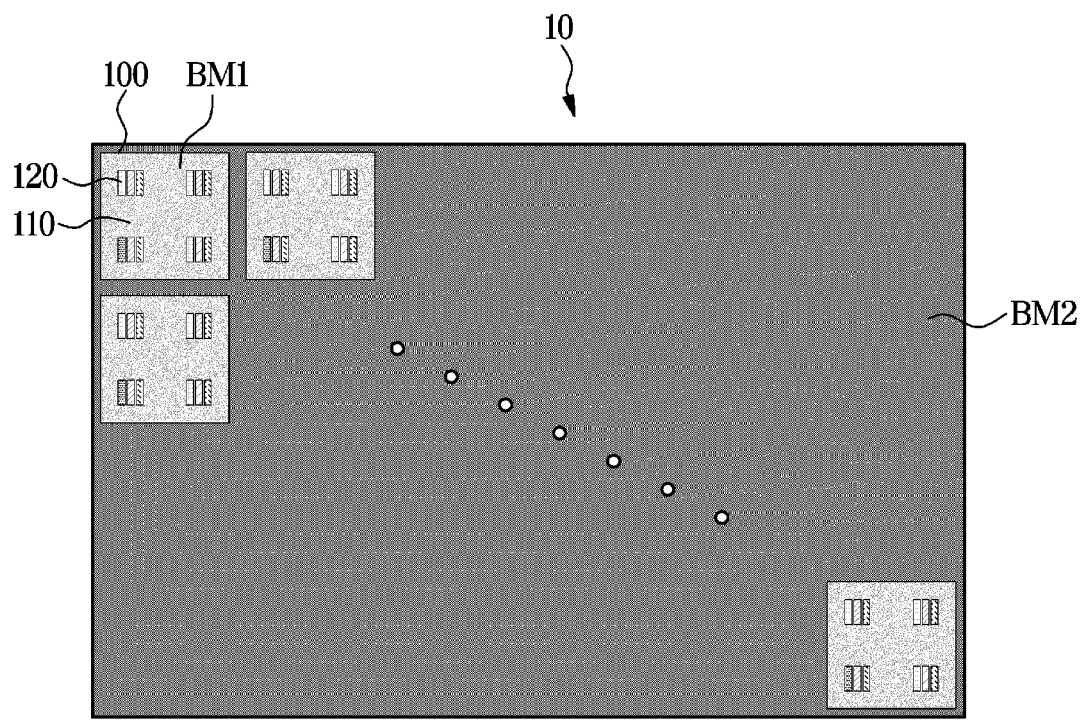
FIGS. 29 and 30 illustrate a black matrix (BM) process performed on a plurality of display modules in a display device, according to an embodiment.
Figure 30:
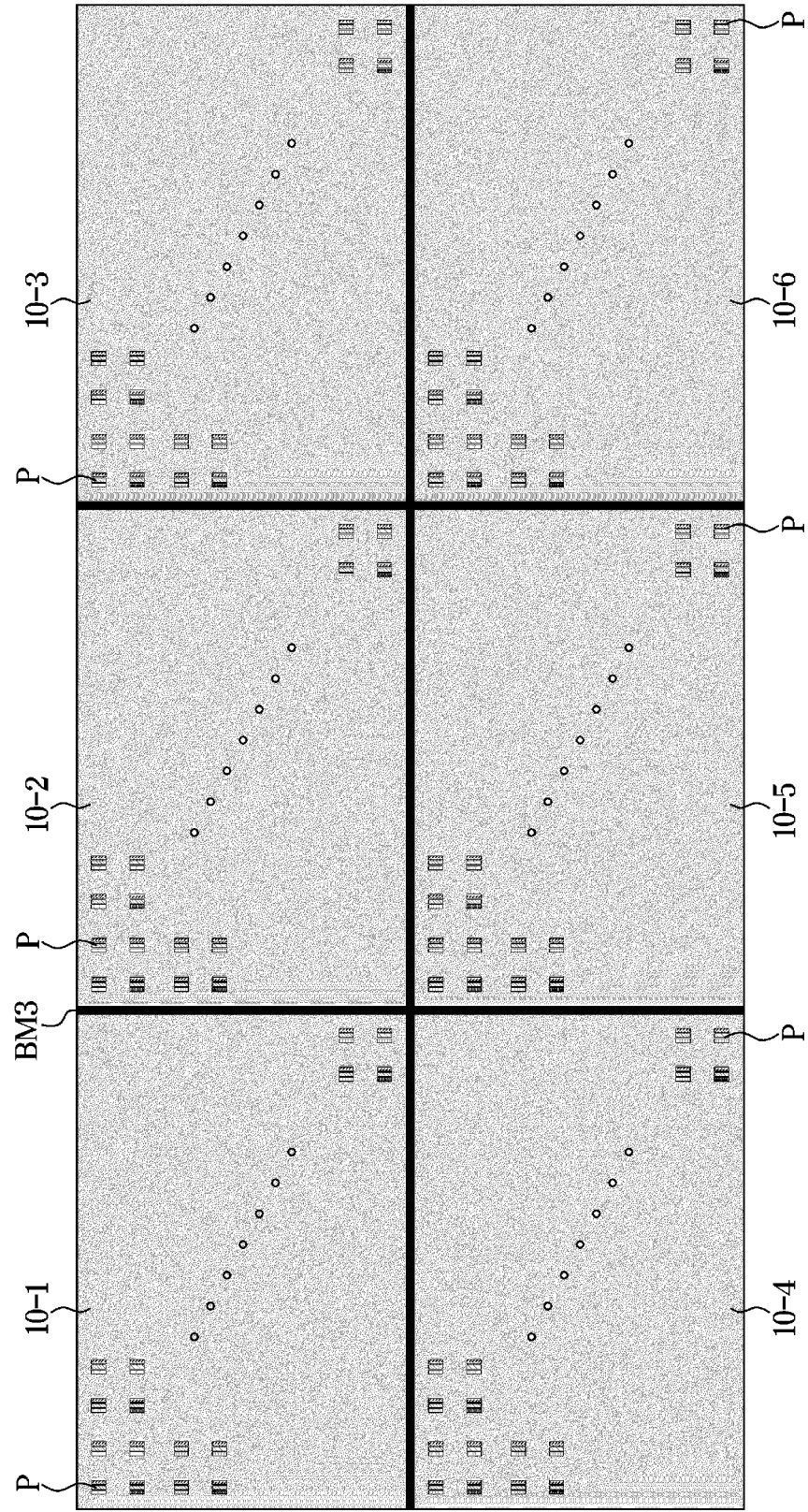

FIGS. 29 and 30 illustrate a black matrix (BM) process performed on a plurality of display modules in a display device, according to an embodiment.

Referring to FIG. 29, a BM process may be performed to block unnecessary light other than light required to implement an image, prevent diffused reflection of light in the gap between pixels and enhance contrast.

For example, a BM layer BM1 may be formed on the upper surface of the second substrate 110 by applying one of various BM processing methods such as printing black ink on the upper surface of the second substrate 110, pattering with a black photosensitive material, using black ACF in mounting the inorganic light emitting device 120 on the second substrate 110, etc.

The BM process may also be performed for the space between the plurality of micro pixel packages 100 to prevent diffused reflection of light in the space between the packages. For this, a BM layer BM2 may be formed even on the upper surface of the first substrate 13 by applying one of various BM processing methods such as printing black ink on the upper surface of the first substrate 13, pattering with a black photosensitive material, etc.

Referring to FIG. 30, the BM process may be performed for the space between the plurality of display modules 10 as well. For example, a side member BM3 of a light-absorbing material may be formed on the side surfaces of each of the plurality of display modules 10-1 to 10-6, especially, side surfaces adjoining the other display module(s) 10, to prevent diffused reflection of light in the space between the modules and gain a seamless effect.

A method of manufacturing a display module according to an embodiment will now be described. According to the method of manufacturing a display module in an embodiment, the aforementioned display module 10 may be manufactured. What are described above with reference to FIGS. 1 to 30 may also be equally applied to the method of manufacturing the display module according to the embodiment.

Figure 31:
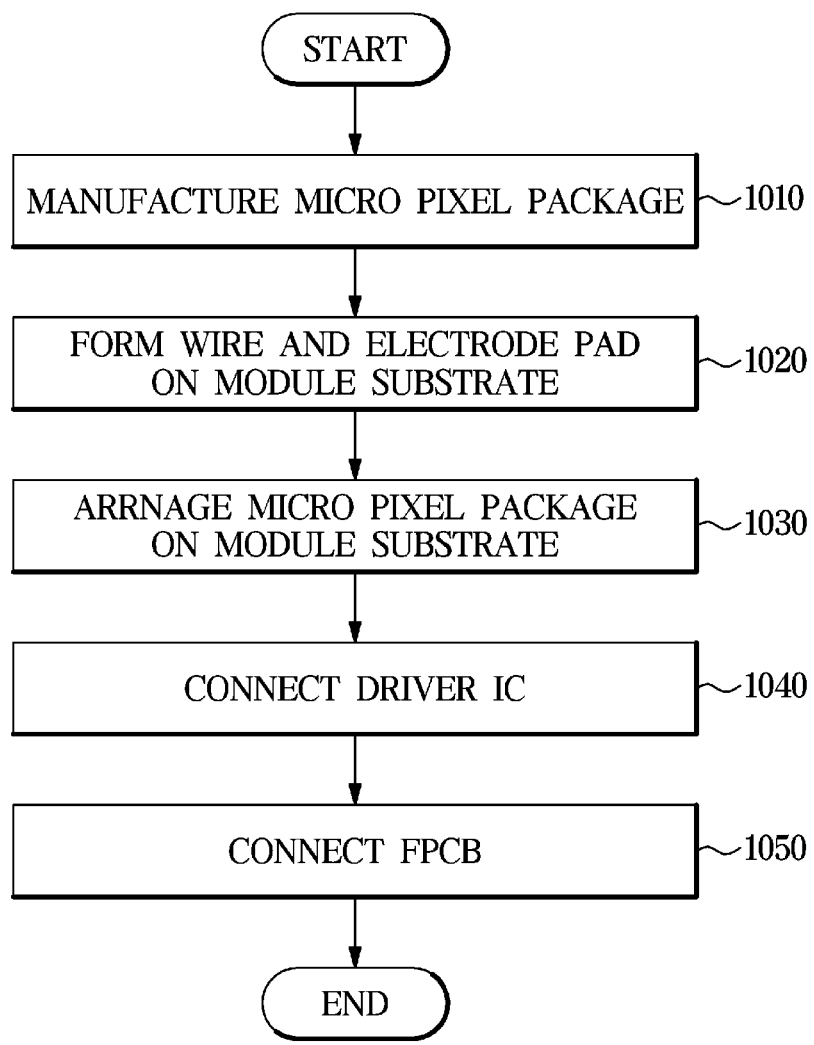
FIG. 31 is a flowchart of a method of manufacturing a display module, according to an embodiment.
Figure 32:
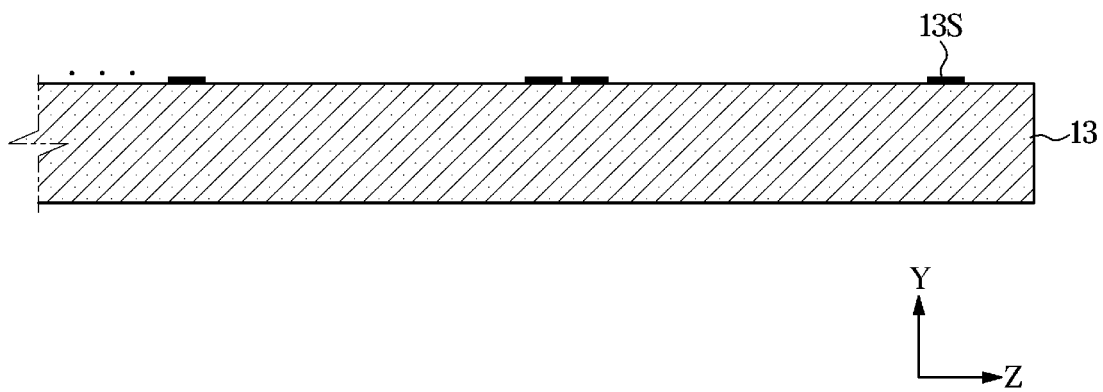
FIG. 32 is a side cross-sectional view of a display module with electrode pads formed thereon in a method of manufacturing the display module, according to an embodiment.
Figure 33:
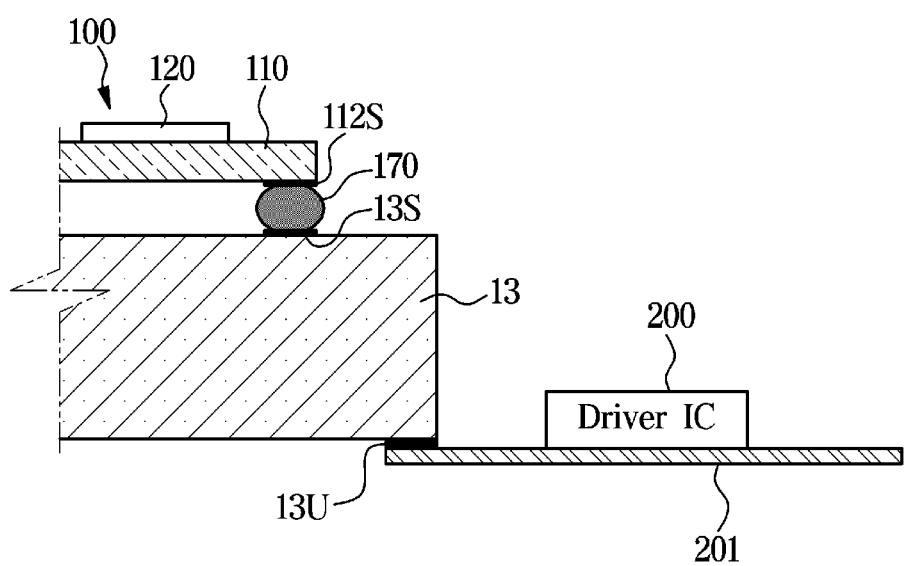
FIG. 33 is a side cross-sectional view of a display module having a driver IC connected to a module substrate in a method of manufacturing the display module, according to an embodiment.
Figure 34:
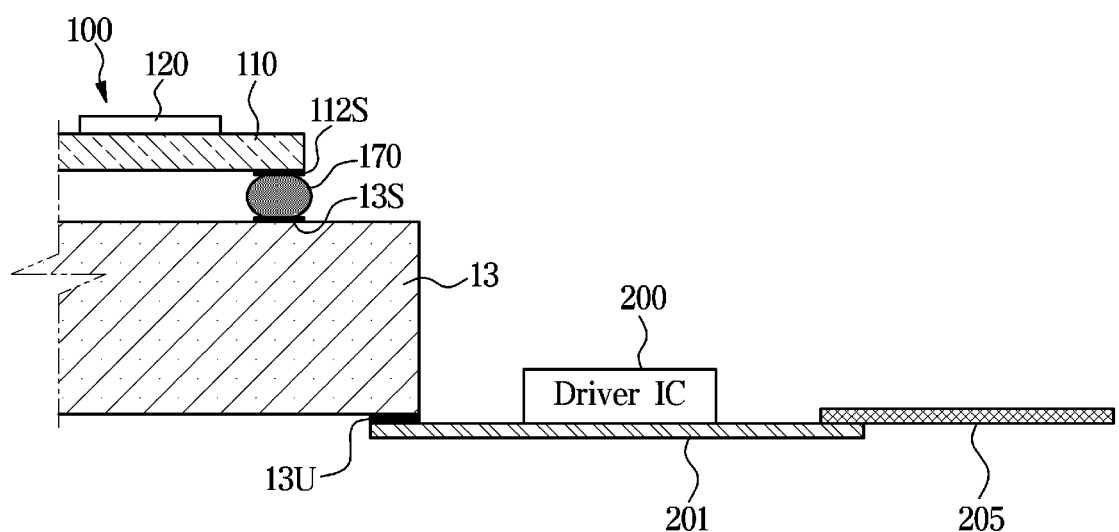
FIG. 34 is a side cross-sectional view of a display module with a flexible printed circuit board (FPCB) connected to a module substrate in a method of manufacturing the display module, according to an embodiment.

FIG. 31 is a flowchart of a method of manufacturing a display module, according to an embodiment. FIG. 32 is a side cross-sectional view of a display module with electrode pads formed thereon in a method of manufacturing the display module, according to an embodiment, FIG. 33 is a side cross-sectional view of a display module having a driver IC connected to a module substrate in a method of manufacturing the display module, according to an embodiment, and FIG. 34 is a side cross-sectional view of a display module with an FPCB connected to a module substrate in a method of manufacturing the display module, according to an embodiment.

Referring to FIG. 31, a micro pixel package is manufactured, in 1010.

The micro pixel package 100 is a package in which the plurality of inorganic light emitting devices 120 and the micro pixel controller 130 controlling the plurality of inorganic light emitting devices 120 are integrated, and has the same structure as what is described in the aforementioned embodiment of the display module 10. A manufacturing process will now be described in detail.

Wires and electrode pads are formed on a module substrate in 1020.

The module substrate refers to the first substrate 13. The wires and electrode pads may be formed on the upper surface of the first substrate 13 to be electrically connected to the micro pixel package 100, and also formed on the lower surface of the first substrate 13 to be connected to the driver IC 200, the driving board 501, the power board 601, etc. Furthermore, to connect the upper wire to the lower wire, the side wire 13SL may be formed on a side surface of the first substrate 13 or the via hole wire 13VL may be formed to pass through the first substrate 13.

For example, the wires and the electrode pads may be formed on the first substrate 13 through a photolithography process including a procedure for forming a layer of a metal substance such as copper on the upper surface of the first substrate 13, applying a photosensitive material, exposing the photosensitive material to light, and developing, etc., and an etching process of selectively removing an unnecessary portion.

In this manner, as shown in FIG. 32, the plurality of first soldering pads 13S may be formed on the upper surface of the first substrate 13. Although not shown, for electrical connection to the driver IC 200 or the power board 601, upper wires extending from the plurality of first soldering pads 13S may also be formed.

Lower wires or lower electrode pads for electrical connection to the driver IC 200 or the power board 601 may also be formed.

As shown in FIG. 31, the micro pixel package is arranged on the module substrate on which the wires and electrode pads are formed, in 1030.

To arrange the micro pixel package 100 on the first substrate 13, the solder ball 170 as described above in FIG. 22 may be used. Specifically, the micro pixel package 100 may be electrically connected to the first substrate 13 by the BGA soldering method.

For example, the solder ball 170 is attached onto the first soldering pad 13S formed on the upper surface of the first substrate 13, and reflow soldering may be performed while the second soldering pad 112S formed on the lower surface of the micro pixel package 100 is attached to the top of the solder ball 170. On the contrary, it is also possible to solder the first substrate 13 after the solder ball 170 is attached to the second soldering pad 112S formed on the micro pixel package 100.

The height h1 of the solder ball 170 may be set to be greater than the height h2 of the micro pixel controller 130 to prevent the micro pixel controller 130 from touching the first substrate 13 and being damaged or prevent the micro pixel package 100 and the first substrate 13 from making wrong connection.

In determining the height h1 of the solder ball 170, as shown in FIG. 23, thickness of the first soldering pad 13S and the second soldering pad 13S located above and under the solder ball 170 may be taken into account in the soldering, and thickness of the connection pin 135 and the lower electrode pad 112 used to electrically connect the micro pixel controller 130 to the second substrate 110 may also be taken into account.

Before the micro pixel package 100 is arranged on the first substrate 13, decision on whether the inorganic light emitting devices 120 are defective or undefective may be made for each micro pixel package 100, and only the micro pixel package 100 with the inorganic light emitting devices 120 determined to be undefective may be mounted on the first substrate. Inspection reliability may be increased and defective products may be easily replaced by performing the decision for each package.

As shown in FIG. 31, the driver IC is connected to the module substrate in 1040, and the FPCB is connected in 1050.

For example, when the COF bonding is employed, as shown in FIG. 33, the driver IC 200 may be mounted on the film 201 and the film 201 on which the driver IC 200 is mounted may have one end electrically connected to the first substrate 13.

For example, the one end of the film 201 on which the driver IC 200 is mounted may be electrically connected to the lower electrode pad 13U arranged on the lower surface of the first substrate 13.

As shown in FIG. 34, the other end of the film 201 on which the driver IC 200 is mounted may be electrically connected to the FPCB 205. The FPCB 205 may then be electrically connected to the driving board 501 to send a timing control signal, image data, etc., output from the driving board 501 to the driver IC 200.

The driver IC 200 may send a driving signal to the micro pixel package 100 arranged on the upper surface of the first substrate 13 through the aforementioned side wire 13SL or the via hole wire 13VL.

The first substrate 13 may also be connected to the FPCB to receive power, and the FPCB to supply power may be electrically connected to the power board 601 to apply power voltage $V_{DD}$ or the reference voltage $V_{SS}$ to the micro pixel controller 130 or the inorganic light emitting device 120.

The display device 1 may be manufactured by having the display module 10 manufactured in the aforementioned process connected to the main board 300, the driving board 500 and the power board 600 and mounted in the housing 20.

To implement a large-area screen, the display device 1 may be manufactured by installing and tiling the plurality of display modules 10 manufactured in the aforementioned process on the frame 21 and connecting the plurality of display modules 10 to the main board 300, the driving board 500 and the power board 600.

A method of manufacturing the display module may include all the aforementioned processes or may include only some of the processes. Alternatively, a further process may be added.

For example, the process of manufacturing the micro pixel package in 1010 may be excluded, or only the process of manufacturing the micro pixel package in 1010 may be included but the processes of connecting the driver IC to the FPCB in 1040 and 1050 may be excluded.

Figure 35:
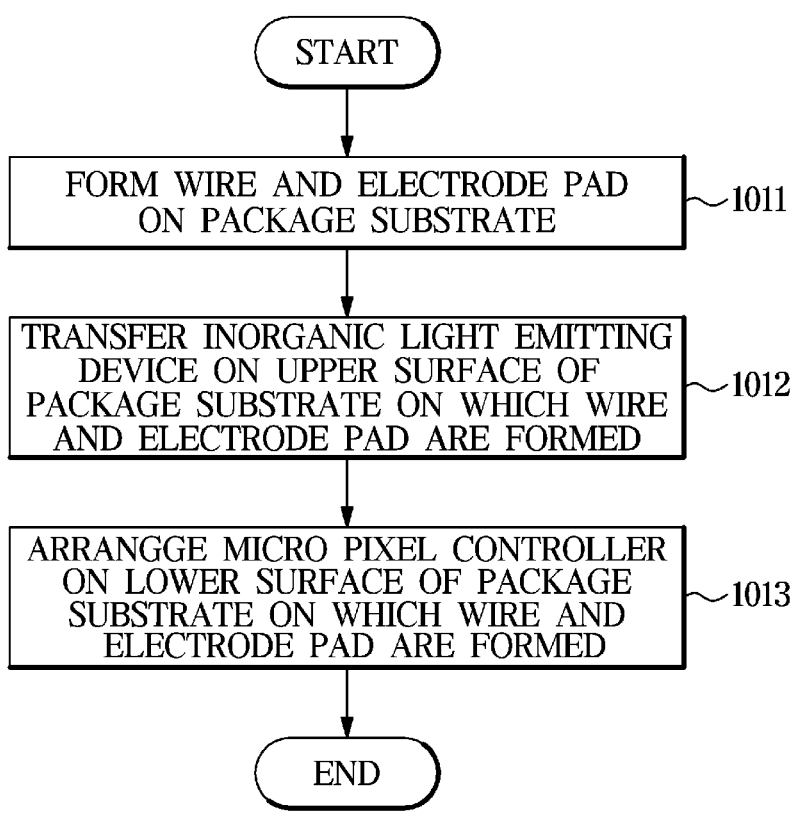
FIG. 35 is a flowchart illustrating a process of manufacturing a micro pixel package in a method of manufacturing a display module, according to an embodiment.

FIG. 35 is a flowchart illustrating a process of manufacturing a micro pixel package in a method of manufacturing a display module, according to an embodiment. FIGS. 36 to 40 are diagrams illustrating a display module manufactured in several steps shown in FIG. 35.

Referring to FIG. 35, wires and electrode pads are formed on a package substrate, in 1011.

The package substrate refers to the second substrate 110 as described above, and the wires and electrode pads may all be formed on the upper surface and the lower surface of the second substrate 110. For example, the wires and the electrode pads may be formed through a photolithography process including a procedure for forming a layer of a metal substance such as copper on the upper surface and the lower surface of the second substrate 110, applying a photosensitive material, exposing the photosensitive material to light, and developing, etc., and an etching process of selectively removing the unnecessary portion.

Figure 36:
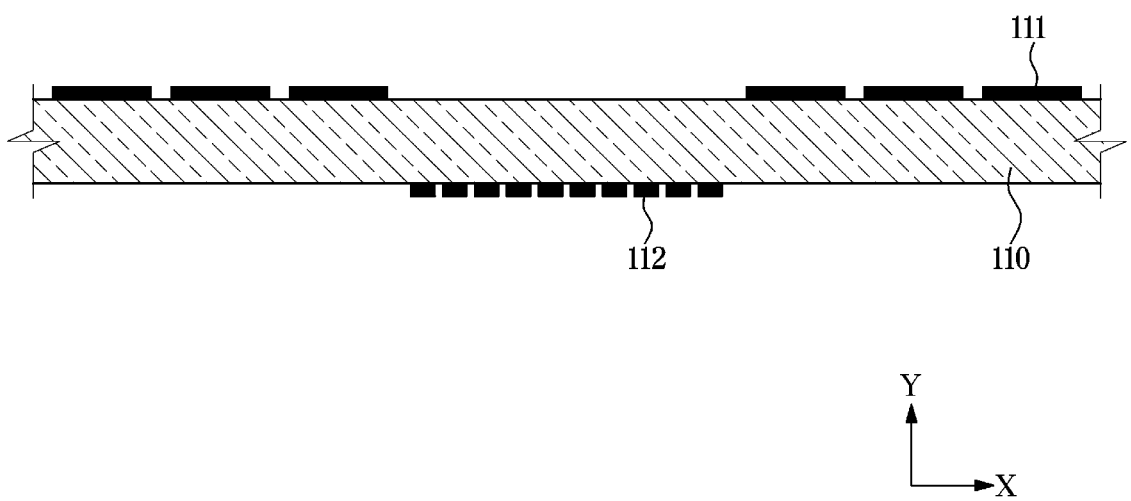
FIGS. 36 to 40 are diagrams illustrating a display module manufactured in several steps shown in FIG. 35.
Figure 37:
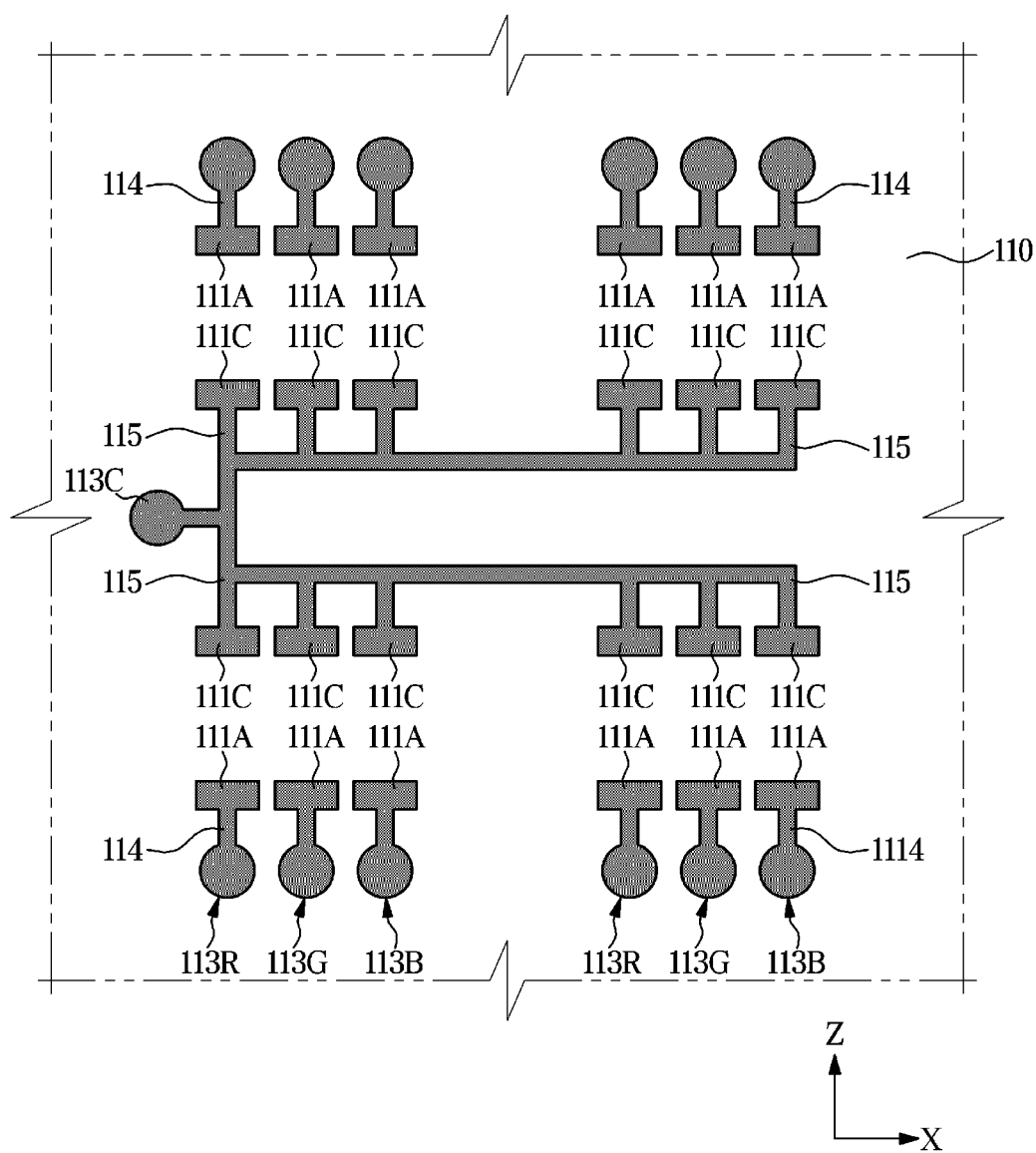
Figure 38:
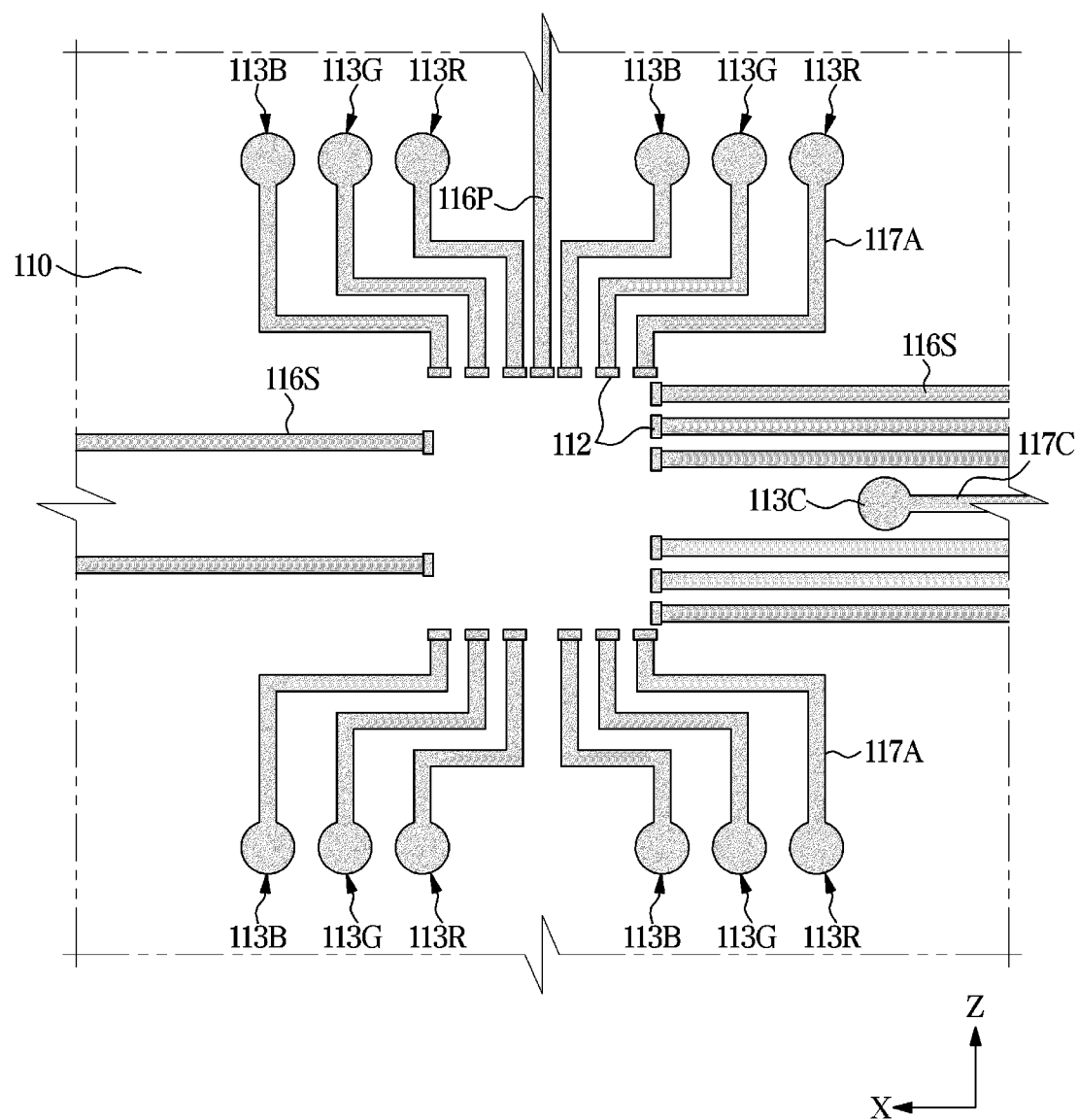

FIG. 36 is a side cross-sectional view of the second substrate 110 on which electrode pads are formed, FIG. 37 is a top view of the second substrate 110 on which wires and electrode pads are formed, and FIG. 38 is a bottom view of the second substrate 110 on which wires and electrode pads are formed.

As shown in FIG. 36, the upper wires (not shown) and the upper electrode pads 111 may be formed on the upper surface of the second substrate 110 in the aforementioned procedure, and the lower wires (not shown) and the lower electrode pads 112 may be formed on the lower surface of the second substrate 110.

The via hole wire 113 or the side wire 150 may be formed to electrically connect the upper wires formed on the upper surface of the second substrate 110 to the lower wires formed on the lower surface of the second substrate 110.

FIGS. 37 and 38 illustrate a micro pixel package on which via hole wires are formed. In the case of forming the via hole wires 113, via holes that pass through the second substrate 110 may be formed, inner walls of the via holes may be plated with a conductive material 113a such as copper, and the via holes may then be filled with the filling material 113b through the via filling. In this manner, the via hole wires 113R, 113G and 113B corresponding to the plurality of inorganic light emitting devices 120R, 120G and 120B may be formed.

Explaining the structure of the wires, electrode pads and via hole wires formed in the aforementioned procedure in detail, as shown in FIG. 37, the anode pads 111A connected to the anodes 121 of the plurality of inorganic light emitting devices 120 and the cathode pads 111C connected to the cathodes 122 of the plurality of inorganic light emitting devices 120 may be arranged on the upper surface of the second substrate 110.

The anode pads 111A may be connected to the via hole wires 113R, 113G and 113B by the anode wires 114 of the upper wires on the second substrate 110. A driving current applied from the micro pixel controller 130 may be applied to the anodes 121 through the via hole wires 113R, 113G and 113B connected to the anode wires 114.

The via hole wire 113C for applying the common reference voltage $V_{SS}$ to the cathodes 122 may be formed to pass through the second substrate 110, and cathode pads 111C connected to the cathodes 122 of the inorganic light emitting devices 120R, 120G and 120B may be connected to the via hole wire 113C by the cathode wires 115 of the upper wires of the second substrate 110. The reference voltage $V_{SS}$ applied from the power board 601 may be applied to the cathodes 122 through the via hole wire 113C connected to the cathode wires 115.

Referring to FIG. 38, the lower wires 117A and the lower electrode pads 112 may be formed on the lower surface of the second substrate 110 to electrically connect the via hole wires 113R, 113G, and 113B connected to the anodes 121 of the inorganic light emitting devices 120R, 120G and 120B to the micro pixel controller 130.

The lower wire 117C may be formed on the lower surface of the second substrate 110 to electrically connect the via hole wire 113C connected to the cathodes 122 of the inorganic light emitting devices 120R, 120G and 120B to the FPCB for supplying power.

The lower wire 116S for applying a gate signal and a data signal or a lower wire 116P for applying the power voltage $V_{DD}$ to the micro pixel controller 130 may be formed on the lower surface of the second substrate 110. The lower wires 116S and 116P may be electrically connected to the driving board 501 or the power board 601 through the FPCB.

In the case of forming the side wire 150, the upper connection pad 141 may be formed in the upper surface edge area of the second substrate 110, and the lower connection pad 142 may be formed in the lower surface edge area of the second substrate 110. The side wire 150 may be formed on one side of the first substrate 110 adjacent to the upper connection pad 141 and the lower connection pad 142 by applying a conductive material by employing an ink-jet method, a stamping method, a screen printing method, a metal deposition method, a tape-based bonding method, an etching method, etc.

Accordingly, the plurality of inorganic light emitting devices 120 arranged on the upper surface of the second substrate 110 may be electrically connected to the micro pixel controller 130 arranged on the lower surface of the first substrate 110 through the upper wire, the upper connection pad 141, the side wire 150, the lower connection pad 142 and the lower wire.

As shown in FIG. 35, an inorganic light emitting device is transferred onto the upper surface of the package substrate on which the wires and the electrode pads are formed, in 1012.

As described above, the inorganic light emitting device 120 may be a micro LED. A micro LED on a wafer or a temporary substrate is picked up, moved, and transferred onto the second substrate 110. In this case, the inorganic light emitting device 120 may be transferred so that the anode 121 and the cathode 122 face the upper surface of the second substrate 110. The transfer method may employ any known technology such as a laser based method, a stamp based method, a roller based method, etc.

A soldering material or a conductive adhesive may be placed or applied on the anode pad 111A and the cathode pad 111C formed on the upper surface of the second substrate 110 according to a method of connecting the inorganic light emitting device 120 to the upper electrode pad 111.

Figure 39:
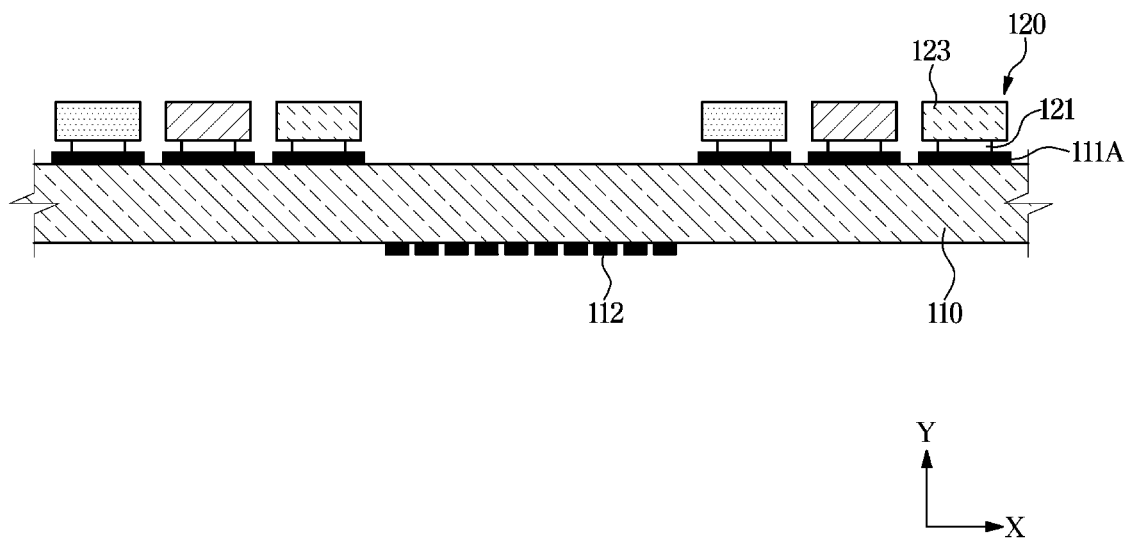

FIG. 39 is a side cross-sectional view of the second substrate 110 on which electrode pads are transferred. By transferring the inorganic light emitting device 120 on the upper surface of the second substrate 110 on which a soldering material or a conductive adhesive is placed or applied, the anode 121 of the inorganic light emitting device 120 may be electrically connected to the anode pad 111A and the cathode 122 of the inorganic light emitting device 120 may be electrically connected to the cathode pad 111C, as shown in FIG. 39.

As shown in FIG. 35, a micro pixel controller may be arranged on the lower surface of a package substrate on which the wires and electrode pads are formed, in 1013.

The micro pixel controller 130 may have the pixel circuit 131 for controlling the inorganic light emitting device 120 formed on the third substrate 132, and the structure and operation of the micro pixel controller 130 is the same as what is described in the aforementioned embodiment of the display module 10.

Before the micro pixel controller 130 is mounted on the second substrate 110, individual circuit inspection may be performed and only the micro pixel controller 130 determined by the circuit inspection to be undefective may be mounted on the second substrate 110. This facilitates circuit inspection and replacement of a defective product as compared to an occasion when the thin film transistor circuit is mounted directly on the module substrate.

Figure 40:
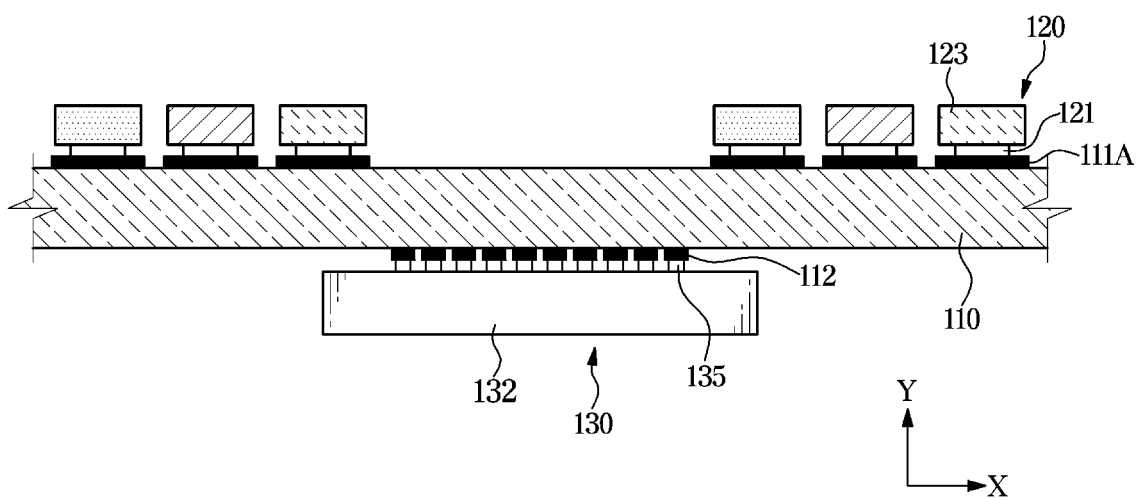

FIG. 40 is a side cross-sectional view of the first substrate 110 on which a micro pixel controller is arranged. As shown in FIG. 40, the micro pixel controller 130 may be arranged on the second substrate 110 by electrically connecting the connection pin 135 equipped in the micro pixel controller 130 to the lower electrode pad 112 formed on the lower surface of the second substrate 110. For example, the connection pin 135 and the lower electrode pad 112 may be electrically connected by soldering or conductive adhesion.

The above description illustrates the disclosure. Embodiments of the disclosure are described above, and the disclosure may be used in other various combinations and alterations of the embodiments, and environments. The disclosure may be changed or modified within a range equivalent to what is described above and/or a range of technologies or knowledge of ordinary skill in the art. The aforementioned embodiments of the disclosure are for explaining the best modes to practice the technical idea of the disclosure, and many different modifications thereto may be made for a specific application area and usage. Accordingly, the embodiments of the disclosure are not intended to limit the scope of the disclosure to what are disclosed above. The appended claims are to be interpreted as including other embodiments.

The invention claimed is:

1. A display module including a plurality of pixels, the display module comprising:
   a first substrate;
   a plurality of micro pixel packages provided on an upper surface of the first substrate; and
   a driver integrated circuit (IC) configured to transmit a driving signal to the plurality of micro pixel packages,
   wherein each micro pixel package of the plurality of micro pixel packages comprises:
      a second substrate;
      a plurality of inorganic light emitting devices provided on an upper surface of the second substrate; and
      a micro pixel controller provided on a lower surface of the second substrate, the micro pixel controller being configured to control the plurality of inorganic light emitting devices based on the driving signal transmitted from the driver IC.

2. The display module of claim 1,
   wherein each pixel of the plurality of pixels comprises at least two inorganic light emitting devices of the plurality of inorganic light emitting devices, and
   wherein the plurality of inorganic light emitting devices form at least two pixels of the plurality of pixels.

3. The display module of claim 1, wherein each micro pixel package of the plurality of micro pixel packages is electrically connected to the first substrate by at least one solder ball.

4. The display module of claim 3, wherein the at least one solder ball has a height that is greater than a thickness of the micro pixel controller.

5. The display module of claim 1, wherein the micro pixel controller is further configured to switch the plurality of inorganic light emitting devices and apply a driving current to the plurality of inorganic light emitting devices.

6. The display module of claim 1, wherein the micro pixel controller comprises:
a third substrate; and
at least one thin film transistor disposed on the third substrate, and
wherein the at least one thin film transistor is configured to switch the plurality of inorganic light emitting devices and apply a driving current to the plurality of inorganic light emitting devices.

7. The display module of claim 6, wherein the at least one thin film transistor comprises a low temperature polycrystalline silicon (LTPS) thin film transistor.

8. The display module of claim 7,
wherein the second substrate comprises a glass substrate, and
wherein the third substrate comprises a silicon substrate.

9. The display module of claim 1, wherein the plurality of pixels have gaps of a same size between neighboring pixels of the plurality of pixels.

10. The display module of claim 9, wherein at least some of the plurality of inorganic light emitting devices and a portion of the micro pixel controller overlap each other in a vertical direction.

11. The display module of claim 1, wherein the plurality of micro pixel packages are arranged so that gaps between neighboring pixels of the plurality of pixels are the same.

12. The display module of claim 1, wherein each pixel of the plurality of pixels comprises at least three sub-pixels which are configured to output different color of light, respectively.

13. The display module of claim 1, wherein each pixel of the plurality of pixels comprises a red inorganic light emitting device, a green inorganic light emitting device, and a blue inorganic light emitting device of the plurality of inorganic light emitting devices.

14. The display module of claim 1, wherein the micro pixel controller is electrically connected to the plurality of inorganic light emitting devices through at least one of a via hole wire and a side wire provided on the second substrate.

15. The display module of claim 1, further comprising:
a black matrix layer provided on the upper surface of the first substrate; and
a black matrix layer provided on the upper surface of the second substrate.

16. A display including a plurality of pixels, the display comprising:
a plurality of display modules;
a housing configured to present the plurality of display modules in a two-dimensional array; and
a timing controller configured to send a display signal to the plurality of display modules,
wherein each of the plurality of display modules comprises:
a first substrate,
a plurality of micro pixel packages disposed on an upper surface of the first substrate, and
a driver integrated circuit (IC) configured to transmit a driving signal to
the plurality of micro pixel packages, and wherein each micro pixel package of the plurality of micro pixel packages comprises:
a second substrate,
a plurality of inorganic light emitting devices disposed on an upper surface of the second substrate, and
a micro pixel controller disposed on a lower surface of the second substrate, the micro pixel controller being configured to control the plurality of inorganic light emitting devices based on the driving signal transmitted from the driver IC.

17. The display of claim 16, wherein the micro pixel controller comprises:
a third substrate; and
at least one thin film transistor disposed on the third substrate,
wherein the at least one thin film transistor is configured to switch the plurality of inorganic light emitting devices and apply a driving current to the plurality of inorganic light emitting devices.

18. The display of claim 17, wherein the at least one thin film transistor comprises a low temperature polycrystalline silicon (LTPS) thin film transistor.

19. The display of claim 18, wherein the second substrate comprises a glass substrate, and
wherein the third substrate comprises a silicon substrate.

20. The display of claim 16, wherein each pixel of the plurality of pixels comprises a red inorganic light emitting device, a green inorganic light emitting device, and a blue inorganic light emitting device of the plurality of inorganic light emitting devices.

* * * * *